United States Patent
Zhang et al.

(10) Patent No.: US 12,210,934 B2
(45) Date of Patent: Jan. 28, 2025

(54) CLOCK SYNCHRONIZATION SYSTEM, SIGNAL SYNCHRONIZATION CONTROL METHOD, AND STORAGE MEDIUM

(71) Applicant: Tencent Technology (Shenzhen) Company Limited, Shenzhen (CN)

(72) Inventors: Hualiang Zhang, Shenzhen (CN); Guanglei Xi, Shenzhen (CN); Mengyu Zhang, Shenzhen (CN); Fuming Liu, Shenzhen (CN); Qiaonian Yu, Shenzhen (CN); Yicong Zheng, Shenzhen (CN); Shengyu Zhang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 526 days.

(21) Appl. No.: 17/583,083

(22) Filed: Jan. 24, 2022

(65) Prior Publication Data

US 2022/0335324 A1  Oct. 20, 2022

Related U.S. Application Data

(63) Continuation of application No. PCT/CN2021/113778, filed on Aug. 20, 2021.

(30) Foreign Application Priority Data

Apr. 19, 2021 (CN) .......................... 202110420565.5

(51) Int. Cl.
*G06F 1/12* (2006.01)
*G06F 13/42* (2006.01)
(Continued)

(52) U.S. Cl.
CPC ............. *G06N 10/40* (2022.01); *G06N 10/70* (2022.01); *G06N 10/80* (2022.01)

(58) Field of Classification Search
CPC ......... G06N 10/70; G06N 10/40; G06N 10/80
See application file for complete search history.

(56) References Cited

U.S. PATENT DOCUMENTS 6,794,912 B2 * 9/2004 Hirata ...................... H03L 7/07
                                                                  327/158
11,969,154 B2 * 4/2024 Kato .................... H04N 23/555
(Continued)

FOREIGN PATENT DOCUMENTS

CN  102938678 A  2/2013
CN  103675443 A  3/2014
(Continued)

OTHER PUBLICATIONS

Tencent Technology, WO, PCT/CN2021/113778, Jan. 19, 2022, 3 pgs.
(Continued)

*Primary Examiner* — Mohammed H Rehman
(74) *Attorney, Agent, or Firm* — Morgan, Lewis & Bockius LLP

(57) ABSTRACT

This application discloses a clock synchronization system, including a quantum control processor (QCP) and N digital/analog mutual conversion devices, each digital/analog mutual conversion device including a frequency conversion module and a signal synchronization module that includes a D flip-flop (DFF). The QCP generates a global synchronization signal and reference clock signals; and transmits the global synchronization signal and a reference clock signal to the frequency conversion module and transmits the global synchronization signal to the signal synchronization module of each conversion device. The frequency conversion module performs frequency conversion processing on the refer- (Continued)

ence clock signal to obtain a target clock signal, and generates a signal synchronization instruction according to the global synchronization signal; and transmits the signal synchronization instruction and the target clock signal to the signal synchronization module. The signal synchronization module performs, based on the global synchronization signal, signal synchronization on the target clock signal through the DFF.

20 Claims, 22 Drawing Sheets

(51) Int. Cl.
    *G06N 10/40* (2022.01)
    *G06N 10/70* (2022.01)
    *G06N 10/80* (2022.01)
    *H04L 5/00* (2006.01)
    *H04L 7/00* (2006.01)

(56) References Cited

U.S. PATENT DOCUMENTS

| | | | |
|---|---|---|---|
| 2005/0231244 A1 | 10/2005 | Hartfiel et al. | |
| 2012/0166856 A1 | 6/2012 | Bal et al. | |
| 2013/0058437 A1* | 3/2013 | Oshima | H03M 1/0836 341/166 |
| 2015/0162917 A1* | 6/2015 | Tsukuda | H03M 3/30 327/156 |
| 2018/0246142 A1* | 8/2018 | Glover | G01D 18/00 |
| 2019/0011586 A1* | 1/2019 | Iranpour | G01V 1/30 |
| 2020/0084033 A1 | 3/2020 | Lamas-Linares et al. | |
| 2021/0026162 A1 | 1/2021 | Apisdorf et al. | |
| 2022/0302920 A1* | 9/2022 | DeMarco | G01S 7/282 |
| 2023/0032250 A1 | 2/2023 | Luo et al. | |
| 2024/0264315 A1* | 8/2024 | Joo | G01S 19/37 |

FOREIGN PATENT DOCUMENTS

| | | |
|---|---|---|
| CN | 106877961 A | 6/2017 |
| CN | 109683137 A | 4/2019 |
| CN | 109828631 A | 5/2019 |
| CN | 110830742 A | 2/2020 |
| CN | 211123712 U | 7/2020 |
| CN | 111510277 A | 8/2020 |
| CN | 113132077 A | 7/2021 |
| EP | 2991229 A1 | 3/2016 |
| JP | H 05297834 A | 11/1993 |
| WO | WO 2017139683 A1 | 8/2017 |
| WO | WO 2020178640 A1 | 9/2020 |
| WO | WO 2020252157 A1 | 12/2020 |

OTHER PUBLICATIONS

Tencent Technology, IPRP, PCT/CN2021/113778, Oct. 24, 2023, 4 pgs.
Tencent Technology, ISR, PCT/CN2021/113778, Jan. 19, 2022, 2 pgs.
Tencent Technology, European Office Action, EP Patent Application No. 21815876.4, May 10, 2024, 7 pgs.
Tencent Technology, Korean Office Action, KR Patent Application No. 10-2022-7005574, Dec. 18, 2023, 13 pgs.
Donohue Ryan "Synchronization in Digital Logic Circuits", May 5, 2002, XP093004953, 16 pgs., Retrieved from the Internet: https://web.stanford.edu/class/ee183/handouts/synchronization_pres.pdf.
Tencent Technology, Extended European Search Report, EP21815876.4, Dec. 13, 2022, 10 pgs.

* cited by examiner

CLOCK SYNCHRONIZATION SYSTEM, SIGNAL SYNCHRONIZATION CONTROL METHOD, AND STORAGE MEDIUM

CROSS REFERENCE TO RELATED APPLICATIONS

This application is a continuation application of PCT Patent Application No. PCT/CN2021/113778, entitled "A CLOCK SYNCHRONIZATION SYSTEM, A CONTROL METHOD FOR SIGNAL SYNCHRONIZATION, AND STORAGE MEDIA", filed on Aug. 20, 2021, which claims priority to Chinese Patent Application No. 202110420565.5, filed with the State Intellectual Property Office of the People's Republic of China on Apr. 19, 2021, and entitled "CLOCK SYNCHRONIZATION SYSTEM, SIGNAL SYNCHRONIZATION CONTROL METHOD, AND STORAGE MEDIUM", all of which are incorporated herein by reference in their entirety.

FIELD OF THE TECHNOLOGY

This application relates to the field of quantum computer control, and in particular, to clock synchronization and signal synchronization control.

BACKGROUND OF THE DISCLOSURE

In recent years, the quantum science and technology develop by leaps and bounds, and have become a frontier field of a new round of scientific and technological revolution and industrial transformation. Superconducting quantum computation is generally considered as one of solutions that are most likely to first implement practical quantum computation and therefore attracts wide attention. A system of a superconducting quantum computer works in an ultralow-temperature environment, and a core thereof is a superconducting quantum chip, which controls qubits by applying a pulse waveform to a microwave frequency. In addition, an existing semiconductor micromachining process may be utilized to manufacture microwave electronic devices, and therefore the system has become one of relatively reliable physical systems that implement quantum computation currently.

The core of the superconducting quantum computer is a quantum chip and a quantum control and measurement system, where the quantum control and measurement system mainly includes an analog-to-digital conversion (ADC) module and a digital-to-analog conversion (DAC) module. Synchronization among a plurality of modules needs to be implemented through a trigger signal, where the trigger signal is independently generated through one module and is connected to different ADC modules or DAC modules through equal-length coaxial cables, to synchronize the different modules.

However, the trigger signal is generated by a field programmable gate array (FPGA) chip, and consequently may produce a relatively large jitter relative to a clock chip.

SUMMARY

Embodiments of this application provide a clock synchronization system, a signal synchronization control method, and a storage medium. After a global synchronization signal enters a signal synchronization module in a digital/analog mutual conversion device, a target clock signal is relocked to a low-jitter reference clock signal by using one or more D flip-flops (DFFs), thereby reducing signal delay and improving signal synchronization precision.

In view of this, an aspect of this application provides a clock synchronization system, including a quantum control processor (QCP) and N digital/analog mutual conversion devices, each digital/analog mutual conversion device including a frequency conversion module and a signal synchronization module, the signal synchronization module including at least one DFF, and N being an integer greater than 1;

the QCP being configured to generate a global synchronization signal and N reference clock signals, and each reference clock signal corresponding to a respective one of the N digital/analog mutual conversion devices;

the QCP being further configured to transmit the global synchronization signal and a reference clock signal to the frequency conversion module and transmit the global synchronization signal to the signal synchronization module in the corresponding digital/analog mutual conversion device;

the frequency conversion module being configured to perform frequency conversion processing on the received reference clock signal to obtain a target clock signal and generate a signal synchronization instruction according to the received global synchronization signal;

the frequency conversion module being further configured to transmit the signal synchronization instruction and the target clock signal to the signal synchronization module; and the signal synchronization module being configured to perform, in response to the signal synchronization instruction and based on the global synchronization signal, signal synchronization on the target clock signal through the at least one DFF to obtain a synchronized clock signal.

Another aspect of this application provides a signal synchronization control method performed by a clock synchronization system, the clock synchronization system including a quantum control processor (QCP) and N digital/analog mutual conversion devices, each digital/analog mutual conversion device including a frequency conversion module and a signal synchronization module, the signal synchronization module including at least one DFF, N being an integer greater than 1, and the signal synchronization control method including:

generating a global synchronization signal and N reference clock signals by using the QCP, each reference clock signal corresponding to a respective one of the N digital/analog mutual conversion devices;

transmitting the global synchronization signal and a reference clock signal to the frequency conversion module and transmitting the global synchronization signal to the signal synchronization module in the corresponding digital/analog mutual conversion device by using the QCP;

performing, by using the frequency conversion module, frequency conversion processing on the received reference clock signal to obtain a target clock signal, and generating a signal synchronization instruction according to the received global synchronization signal;

transmitting the signal synchronization instruction and the target clock signal to the signal synchronization module by using the frequency conversion module; and performing, in response to the signal synchronization instruction and based on the global synchronization signal, signal synchronization on the target clock signal by using the signal synchronization module through the at least one DFF to obtain a synchronized clock signal.

Another aspect of this application provides a non-transitory computer-readable storage medium, storing a plurality of computer programs, the computer programs, when executed by a clock synchronization system, the clock synchronization system comprising a quantum control processor (QCP) and N digital/analog mutual conversion devices, each digital/analog mutual conversion device comprising a frequency conversion module and a signal synchronization module, the signal synchronization module comprising at least one D flip-flop (DFF), N being an integer greater than 1, being configured to perform the method according to the foregoing aspects.

Another aspect of this application provides a computer program product including a plurality of computer programs, the computer programs including computer instructions, the computer instructions being stored in a non-transitory computer-readable storage medium. A processor of a computer device reads the computer instructions from the computer-readable storage medium, and executes the computer instructions, to cause the computer device to perform the method according to the foregoing aspects.

As can be seen from the foregoing technical solutions, the embodiments of this application have the following advantages:

In the embodiments of this application, a clock synchronization system is provided. According to the foregoing system, the clock synchronization system includes a QCP and N digital/analog mutual conversion devices, each digital/analog mutual conversion device includes a frequency conversion module and a signal synchronization module, and the signal synchronization module includes at least one DFF. The QCP generates a global synchronization signal and N reference clock signals, and the QCP then transmits the global synchronization signal and a reference clock signal to the frequency conversion module and transmits the global synchronization signal to the signal synchronization module in each digital/analog mutual conversion device. The frequency conversion module performs frequency conversion processing on the received reference clock signal to obtain a target clock signal, generates a signal synchronization instruction according to the received global synchronization signal, and then transmits the signal synchronization instruction and the target clock signal to the signal synchronization module. The signal synchronization module finally performs, in response to the signal synchronization instruction and based on the global synchronization signal, signal synchronization on the target clock signal through the at least one DFF to obtain a synchronized clock signal. According to the foregoing system, after the global synchronization signal enters the signal synchronization module in the digital/analog mutual conversion device, the target clock signal is relocked to a low jitter reference clock signal by using one or more DFFs, thereby reducing signal delay and improving signal synchronization precision.

DESCRIPTION OF EMBODIMENTS

Figure 1:
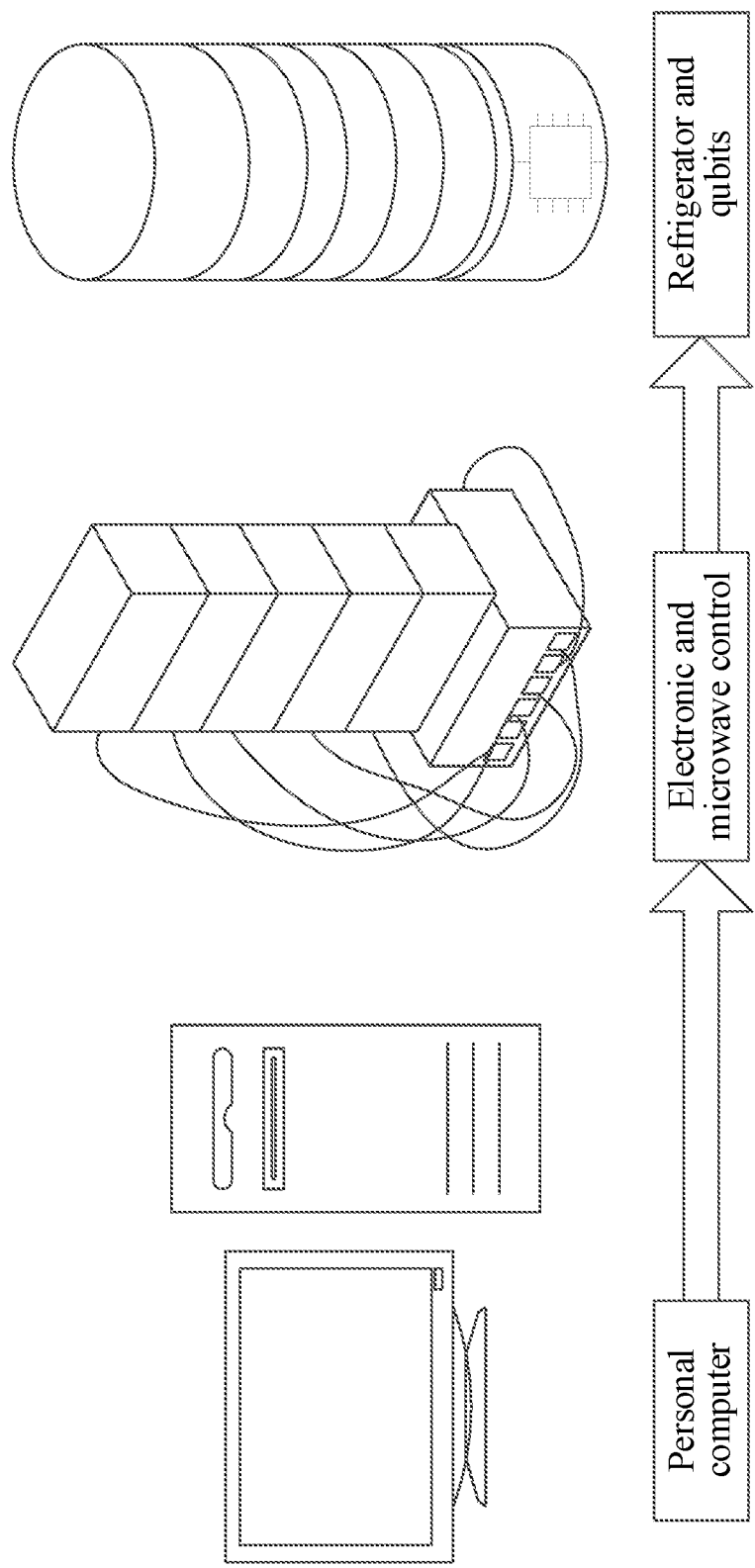
FIG. 1 is a schematic diagram of a basic experimental platform of a superconducting quantum computer according to an embodiment of this application.

Embodiments of this application provide a clock synchronization system, a signal synchronization control method, and a storage medium. After a global synchronization signal enters a signal synchronization module in a digital/analog mutual conversion device, a target clock signal is relocked to a low-jitter reference clock signal by using one or more D flip-flops (DFFs), thereby reducing signal delay and improving signal synchronization precision.

The terms such as "first", "second", "third", and "fourth" (if any) in the specification and claims of this application and in the accompanying drawings are used for distinguishing similar objects and not necessarily used for describing any particular order or sequence. It is to be understood that data used in this way is exchangeable in a proper case, so that the embodiments of this application described herein can be implemented in an order different from the order shown or described herein. In addition, the terms "include", "corresponding to" and any other variants are intended to cover the non-exclusive inclusion. For example, a process, method, system, product, or device that includes a series of steps or units is not necessarily limited to those expressly listed steps or units, but may include other steps or units not expressly listed or inherent to such a process, method, product, or device.

A new discipline, namely, quantum information science is born through a combination of quantum mechanics and classic information science, and mainly covers fields such as quantum communication and quantum computation. Due to great application potential and scientific significance of quantum information technologies, in recent years, quantum information technologies represented by quantum communication technologies attract great attention of the scientific world and the engineering world. Quantum properties have unique functions in the information field, and may break through limits of existing classic information systems in aspects such as improving a computation speed, ensuring information security, increasing an information capacity, and improving detection precision, and therefore a new discipline branch, namely, quantum information science is born as a result. The quantum information science is a product of a combination of quantum mechanics and information science, and includes quantum cryptography, quantum communication, quantum computation, quantum measurement, and the like.

The quantum computation is widely applied. In the field of biological medicine, principles of molecular interaction and chemical reaction may be obtained through simulation of a quantum computer, thereby finding new materials and developing new medicines. The quantum computation may further sequence and analyze genes, and help people know gene expression through large-scale analyses and machine learning. In the field of big data, due to a "superposition" property, the quantum computation has a capability of parallel computation, can accelerate some classic algorithms, and produces many uses in the field of big data processing. In the field of financial engineering, the quantum computation has a capability of analyzing a large amount of data quickly and performing quick execution, which can meet high-frequency trading. In addition, asset and risk management may be further implemented. To construct and manage financial investment combinations, a large amount of technical data needs to be taken into consideration for analysis and determining various strategies, and a plurality of algorithms of the quantum computation can be used for combinatorial optimization of financial products. In the field of aeronautics and astronautics, the quantum computation can be used for resolving problems in the aeronautics and astronautics industry, such as classifying and analyzing images transmitted by satellites and manufacturing novel materials for airplanes.

There are a plurality of solutions for implementing quantum computation, and superconducting quantum computation is one of the most promising general-purpose quantum computer implementation solutions currently due to properties such as long coherence time, good expandability, and accurate control and measurement thereof. Quantum computation is mainly implemented by a quantum computer, and the quantum computer is a type of physical devices that perform high-speed mathematical and logical operations, perform storage, and process quantum information in compliance with laws of the quantum mechanics. A core of the quantum computer is a quantum chip and a quantum control and measurement system, which converts a designed quantum circuit into a corresponding quantum control pulse signal by using the quantum control and measurement system. An analog signal is coupled, in the form of an electromagnetic field, to a physical substrate into which qubits are embedded, to control the quantum computer to operate.

The clock synchronization system and the signal synchronization control method provided in this application are applicable to the quantum control and measurement system in quantum computation, or applicable to a superconducting quantum computer, or applicable to a quantum computation platform based on another physical implementation, to lay a technical foundation for future large-scale quantum computation. For ease of understanding, referring to FIG. 1, FIG. 1 is a schematic diagram of a basic experimental platform of a superconducting quantum computer according to an embodiment of this application. As shown in the figure, a superconducting quantum computation platform is used as an example, which mainly includes a superconducting quantum chip being at a temperature near absolute zero, a dilution refrigerator, a microwave electronics system controlling qubits, and a personal computer (PC) terminal controlling the electronics system. A written quantum program is compiled into an instruction through software on the PC side, the instruction is transmitted to an electronic and microwave control system and converted into an electronic and microwave signal, and the signal is inputted into the dilution refrigerator, to control superconducting qubits being at a temperature less than 10 millikelvins (mK). A read process is opposite to the foregoing process, namely, a read waveform is transmitted to the quantum chip.

A relatively large number of technical terms may be involved in this application. Therefore, for ease of understanding, the technical terms involved in this application will be described below, and specifically:

(1) Quantum computation (QC): QC is a scheme of using superposition and entanglement properties of quantum states to rapidly complete a specific computation task.

(2) Physical qubit: A physical qubit is a qubit implemented by using a real physical device, and includes a data qubit and an ancilla qubit.

(3) Field programmable gate array (FPGA) chip: An FPGA is a semi-custom circuit in application-specific integrated circuits, is a programmable logic array, and can effectively resolve a problem that a quantity of gate circuits of an original device is relatively small. The FPGA adopts a concept of logic cell array (LCA), which may be internally provided with three parts: a configurable logic block (CLB), an input output block (JOB), and an interconnect.

(4) Analog-to-digital conversion (ADC) channel: An ADC channel is a type of devices that are configured to convert continuous signals in an analog form into discrete signals in a digital form.

(5) Digital-to-analog conversion (DAC) channel: A DAC channel is a type of devices that convert a digital signal into an analog signal (in the form of a current, a voltage, or a charge).

(6) Arbitrary waveform generator (AWG): An AWG receives waveform information configured by using a digital signal, and generates a corresponding analog waveform after digital-to-analog conversion. In a quantum control and measurement system, the AWG is configured to generate a waveform controlling and reading qubits.

(7) Digital acquisition (DAQ) unit: A DAQ unit receives an analog signal input, and obtains a corresponding digital signal for subsequent various processing after analog-to-digital conversion. In a quantum control and measurement system, the DAQ unit is configured to receive a read result of a quantum chip.

(8) Quantum control processor (QCP): A QCP is a module executing quantum instructions, receives a result from a DAQ unit in an experiment process, and controls an AWG to transmit a waveform corresponding to a quantum operation. In a quantum control and measurement system, the QCP processes, in real time, instructions generated by a quantum program, to perform program flow control and feedback control.

(9) Quantum control and measurement system: A quantum control and measurement system is a system that executes a quantum program by running a quantum instruction set, provides input signals to a quantum chip for control, and measures the quantum chip to acquire a result. In superconducting quantum computation, a quantum control and measurement system generally includes an AWG, a DAQ unit, and a QCP.

(10) Inter-channel skew: An inter-channel skew refers to a case that different channels transmit signals at the same time and phases of the signals are aligned at an output end.

(11) D flip-flop (DFF): A DFF has an input, an output, and a clock input, and when a clock changes from 0 to 1, a value of the output may be equal to a value of the input. Such a type of flip-flops may be configured to prevent errors caused by noise.

(12) Advanced telecom computing architecture (ATCA): An ATCA is originated from a new-generation mainstream industrial computation technology that is widely applied to fields such as telecom, astronautics, industrial control, medical appliances, intelligent transportation, and military equipment.

(13) Phase locked loop (PLL): A PLL is a frequency and phase control system implemented by using a feedback control principle, and a function thereof is to keep a signal outputted by a circuit in synchronization with a reference signal outside the circuit, where when a frequency or a phase of the reference signal changes, the PLL may detect the change, regulate an output frequency by using a feedback system inside the circuit until the signal and the reference signal are kept in synchronization again, and the synchronization is also referred to as "phase-locked".

(14) Voltage-controlled oscillator (VCO): A VCO is an electronic oscillation circuit design that controls an oscillation frequency by using a voltage input. A VCO refers to an oscillation circuit of which an output frequency and an input control voltage have a correspondence. For an oscillator whose frequency is a function of a voltage of an input signal, when a working state of the oscillator or a component parameter of an oscillation loop is controlled by an input control voltage, a VCO may be formed.

(15) Divider and delay (Div/Dly) unit: A Div unit is a circuit that can perform the following processing on a frequency (fin) of an input signal, to cause a frequency (fout) of an output signal to meet the following relationship, namely fout=fin/N, where N is an integer. A Dly unit is a circuit that delays an input signal by a specific time length.

(16) Gmon: A superconducting qubit architecture combining highly-coherent qubits and adjustable qubit-qubit coupling.

(17) In-phase (I): An in-phase signal in an in-phase quadrature (IQ) signal.

(18) Quadrature (Q): A quadrature signal in an IQ signal, and there is a phase difference of 90 degrees between the quadrature signal and the in-phase signal.

(19) Local oscillator (LO) signal.

(20) Baseband (BB) signal.

(21) Radio frequency (RF) signal.

Figure 2:
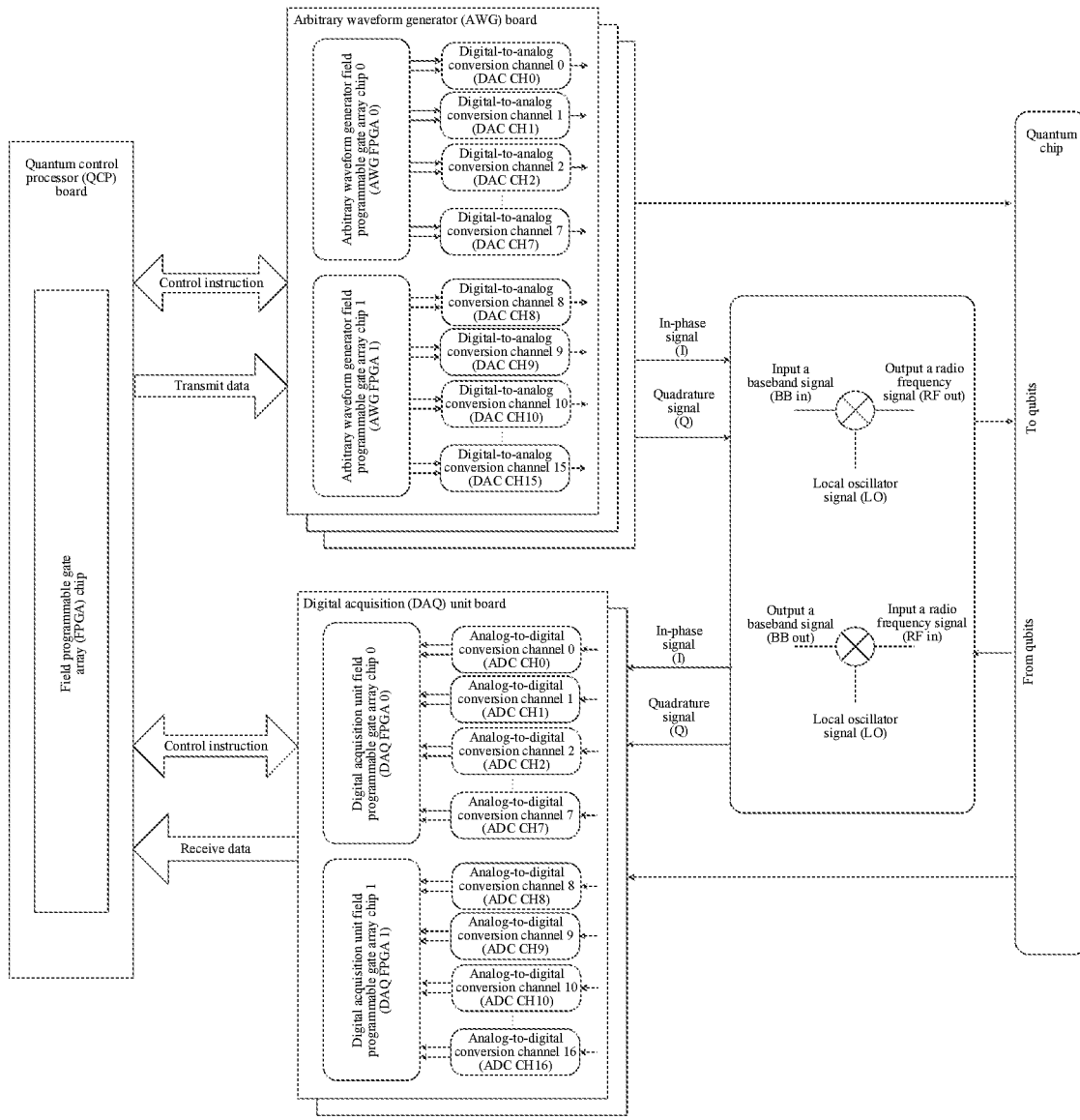
FIG. 2 is a schematic structural diagram of a quantum control and measurement system according to an embodiment of this application.

With reference to the foregoing description, this application provides a quantum control and measurement system, and the quantum control and measurement system in this application will be described below. Referring to FIG. 2, FIG. 2 is a schematic structural diagram of a quantum control and measurement system according to an embodiment of this application. As shown in the figure, the quantum control and measurement system integrates a plurality of AWG boards, a plurality of DAQ unit boards, and 1 QCP board, where each DAQ unit board includes a plurality of ADC channels and a plurality of FPGA chips, and each AWG board includes a plurality of DAC channels and a plurality of FPGA chips. The QCP may control the DAQ units and the AWGs, where a quantity of the DAQ units and a quantity of the AWGs are determined according to a quantity of qubits that need to be controlled and measured and a chip structure. For example, if a 56-bit Gmon needs to be supported, 18 AWGs, 2 DAQ units, and 1 QCP are required.

Based on the quantum control and measurement system shown in FIG. 2, data at outputs of different ADC channels and waveforms at outputs of different DAC channels of each module need to be synchronized, so that an integration system that keeps different data or waveforms of a plurality of channels in synchronization in a cross-module manner is a challenge for a designer. Generally, a synchronization function needs to meet the following three cases. A first case is that all ADC channels in the system need to sample a plurality of inputs at the same time, or sample inputs based on a phase relationship known to each other. A second case is that all DAC channels in the system need to output waveforms at the same time or waveforms of different channels keep known fixed phases. A third case is that the ADC channels and the DAC channels in the system need to sample inputs based on fixed phases known to each other.

Figure 3:
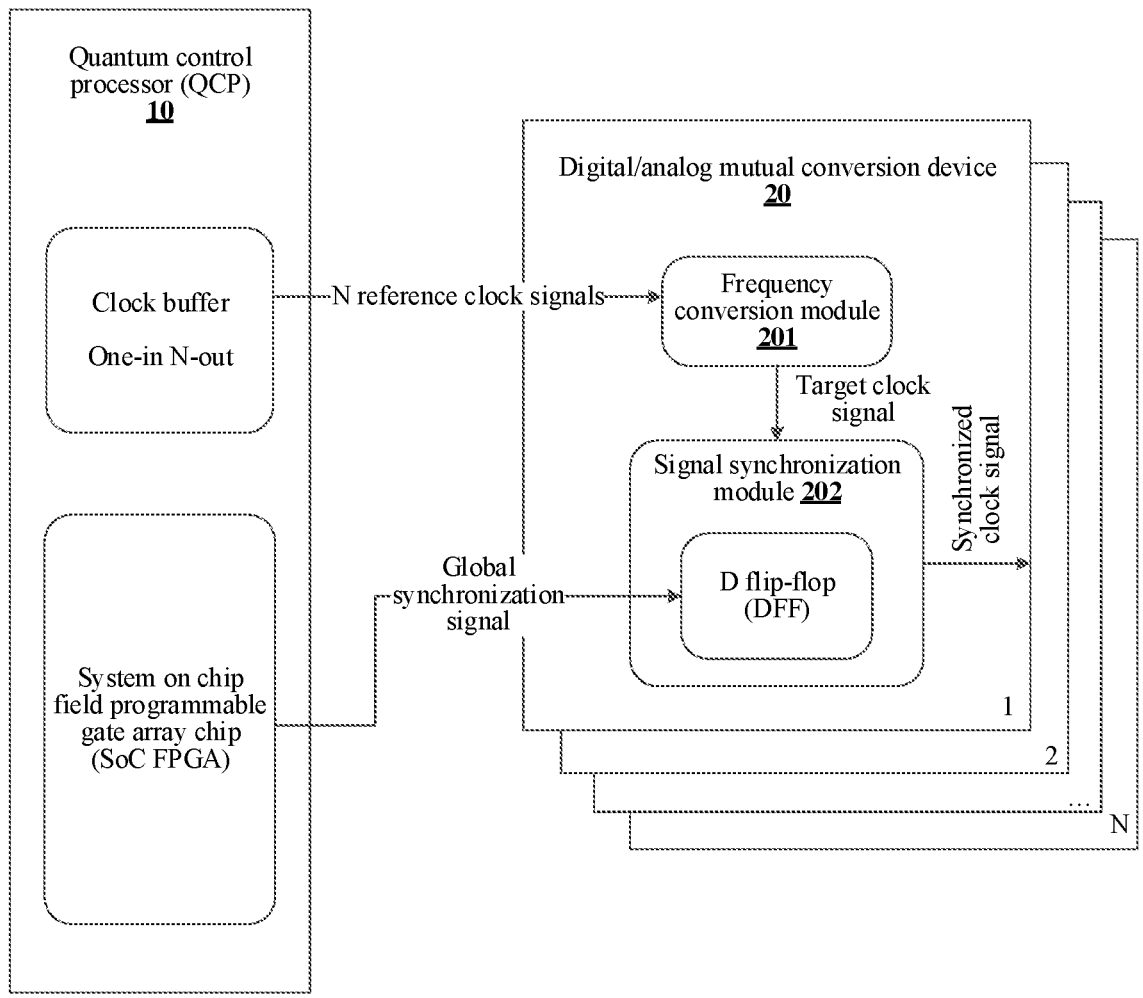
FIG. 3 is a schematic structural diagram of a clock synchronization system according to an embodiment of this application.

Based on this, this application further provides a clock synchronization system. According to the foregoing system, different modules become an organic whole in time sequence by using a synchronization solution. The following describes the clock synchronization system in this application. FIG. 3 is a schematic diagram of an embodiment of a clock synchronization system according to an embodiment of this application. As shown in the figure, the clock synchronization system includes a QCP 10 and N digital/analog mutual conversion devices 20, where each digital/analog mutual conversion device 20 includes a frequency conversion module 201 and a signal synchronization module 202, the signal synchronization module 202 includes at least one DFF, and N is an integer greater than 1.

The QCP 10 is configured to generate a global synchronization signal and N reference clock signals, and each reference clock signal corresponds to one digital/analog mutual conversion device 20.

The QCP 10 is further configured to transmit the global synchronization signal and a reference clock signal to the frequency conversion module 201 and transmit the global synchronization signal to the signal synchronization module 202 in each digital/analog mutual conversion device 20.

The frequency conversion module 201 is configured to perform frequency conversion processing on the received reference clock signal to obtain a target clock signal and generate a signal synchronization instruction according to the received global synchronization signal.

The frequency conversion module 201 is further configured to transmit the signal synchronization instruction and the target clock signal to the signal synchronization module 202.

The signal synchronization module 202 is configured to perform, in response to the signal synchronization instruction and based on the global synchronization signal, signal synchronization on the target clock signal through the at least one DFF to obtain a synchronized clock signal.

In this embodiment, the clock synchronization system is a quantum control and measurement system to which clock synchronization is added, where the N digital/analog mutual conversion devices include at least one AWG and at least one DAQ unit. It may be understood that, one digital/analog mutual conversion device in FIG. 3 corresponds to the AWG or the DAQ unit in FIG. 2, where the frequency conversion module and the signal synchronization module in the digital/analog mutual conversion device are independent of an AWG FPGA chip or a DAQ FPGA chip shown in FIG. 2.

Specifically, the QCP includes a clock buffer and a system on chip FPGA (SoC FPGA) chip. An input of the clock buffer is 1 and an output is N, namely, the clock buffer may output N reference clock signals (REFCLKs), so that each digital/analog mutual conversion device corresponds to one reference clock signal. The SoC FPGA chip outputs a global synchronization signal (Sync_GLB), and the N digital/analog mutual conversion devices all use the uniform global synchronization signal (Sync_GLB). The QCP transmits the global synchronization signal (Sync_GLB) and the corresponding reference clock signal to the frequency conversion module and transmits the global synchronization signal (Sync_GLB) to the signal synchronization module in each digital/analog mutual conversion device.

By using any digital/analog mutual conversion device as an example, the frequency conversion module in the digital/analog mutual conversion device performs frequency conversion processing on the received reference clock signal to obtain a different target clock signal, and generates a signal synchronization instruction according to the received global synchronization signal (Sync_GLB). Therefore, the frequency conversion module transmits the signal synchronization instruction and the target clock signals to the signal synchronization module. The signal synchronization module locks, in response to the signal synchronization instruction and based on the global synchronization signal (Sync_GLB), the target clock signal to a low-jitter reference clock signal by using one level of DFF or a plurality of levels of DFFs, to obtain a new low-jitter synchronization signal.

In the embodiments of this application, a clock synchronization system is provided. According to the foregoing system, after the global synchronization signal enters the signal synchronization module in the digital/analog mutual conversion device, the target clock signal is relocked to a low-jitter reference clock signal by using one or more DFFs, thereby reducing a probability of metastability and a jitter of the synchronization signal, and improving signal synchronization precision.

Figure 4:
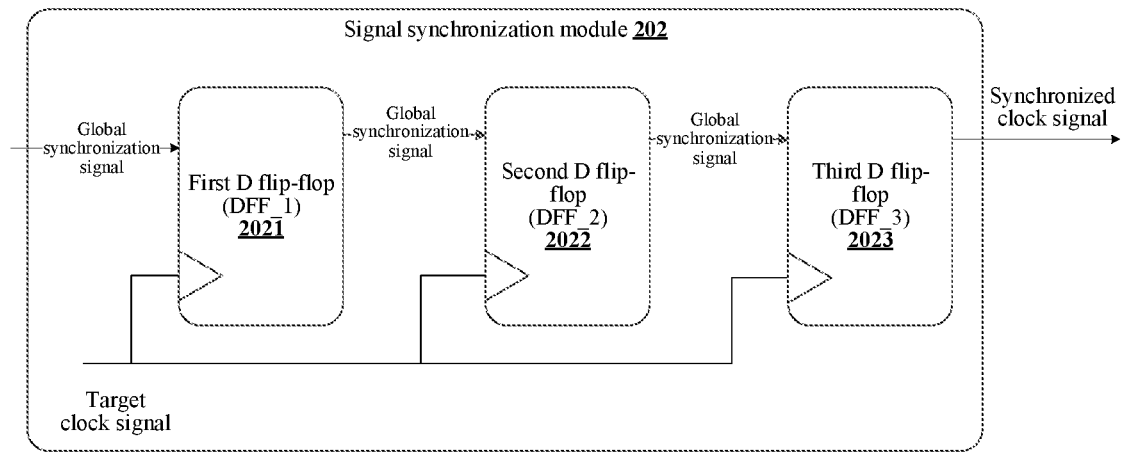
FIG. 4 is a schematic diagram of implementing signal processing based on a plurality of levels of DFFs according to an embodiment of this application.

In some embodiments, based on the embodiment corresponding to FIG. 3, further referring to FIG. 4, FIG. 4 is a schematic diagram of implementing signal processing based on a plurality of levels of DFFs according to an embodiment of this application. With reference to FIG. 3 and FIG. 4, in another embodiment of the clock synchronization system according to an embodiment of this application, the signal synchronization module 202 includes a first DFF 2021, a second DFF 2022, and a third DFF 2023, where the first DFF 2021 is connected to the second DFF 2022, and the second DFF 2022 is connected to the third DFF 2023.

In this embodiment, disposing a plurality of levels of DFFs in the signal synchronization module can reduce a case of metastability. The metastability refers to a phenomenon that in a normal running process, a signal cannot reach stable 0 or 1 within a certain time. In a multi-clock design, the metastability is inevitable, so that it is necessary to reduce generation and spread of the metastability, and eliminate harmful effects of the metastability. An output of the metastability may be a glitch, oscillation, or a fixed voltage value before being stable. Therefore, in addition to a logic misjudgment caused by the metastability, an output of the metastability being an intermediate voltage value between 0 and 1 may cause a next level to produce metastability (namely, leading to spread of the metastability).

Based on this, a plurality of levels of DFFs are disposed in the signal synchronization module. For ease of understanding, referring to FIG. 4 again, and as shown in the figure, signals inputted from the outside are the global synchronization signal (Sync_GLB) and the target clock signals outputted by the frequency conversion module. In the first DFF, the second DFF, and the third DFF, the target clock signals are synchronized by using the global synchronization signal (Sync_GLB), to output a synchronized clock signal.

In addition, in the embodiments of this application, a clock synchronization system is provided. According to the foregoing system, a plurality of DFFs are disposed in the signal synchronization module. By using the foregoing structure, after the first DFF samples an asynchronous input, appearing metastability can be allowed to be outputted for a period, and within the period, properties of the metastability are weakened. Similarly, the second DFF and the third DFF may also reduce a probability of metastability, so that a probability of metastability of an asynchronous signal may be greatly reduced through three levels of DFFs.

Figure 5:
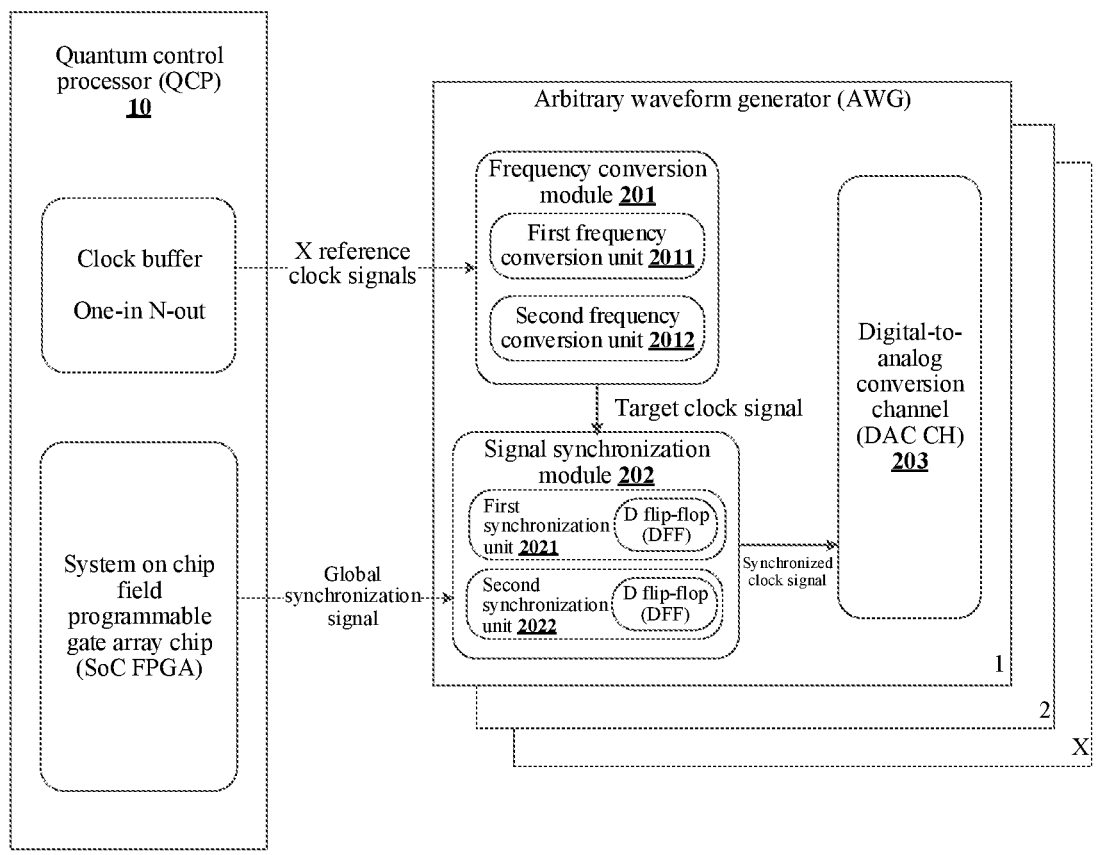
FIG. 5 is a schematic structural diagram of a clock synchronization system-based arbitrary waveform generator (AWG) according to an embodiment of this application.

In some embodiments, based on the embodiment corresponding to FIG. 3, further referring to FIG. 5, FIG. 5 is a schematic structural diagram of a clock synchronization system-based AWG according to an embodiment of this application. With reference to FIG. 3 and FIG. 5, in another embodiment of the clock synchronization system according to an embodiment of this application, the N digital/analog mutual conversion devices 20 include an AWG, the AWG belongs to the digital/analog mutual conversion devices 20, the AWG includes a DAC channel 203, the frequency conversion module 201 includes a first frequency conversion unit 2011 and a second frequency conversion unit 2012, the signal synchronization module 202 includes a first synchronization unit 2021 and a second synchronization unit 2022, the first synchronization unit 2021 includes at least one DFF, and the second synchronization unit 2022 includes at least one DFF.

The first frequency conversion unit 2011 is configured to perform frequency conversion processing on the received reference clock signal to obtain a first frequency clock sub-signal and generate a first synchronization instruction according to the received global synchronization signal, where the first frequency clock sub-signal is included in the target clock signal, and the first synchronization instruction is included in the signal synchronization instruction.

The first frequency conversion unit 2011 is further configured to transmit the first synchronization instruction and the first frequency clock sub-signal to the first synchronization unit 2021.

The first synchronization unit 2021 is configured to perform, in response to the first synchronization instruction and based on the global synchronization signal, signal synchronization on the first frequency clock sub-signal through the at least one DFF included in the first synchronization unit 2021 to obtain a first synchronized clock sub-signal, where the first synchronized clock sub-signal is included in the synchronized clock signal.

The first synchronization unit 2021 is further configured to transmit the first synchronized clock sub-signal to the second frequency conversion unit 2012.

The second frequency conversion unit 2012 is configured to perform frequency conversion processing and delay processing on the received first synchronized clock sub-signal to obtain a second frequency clock sub-signal and generate a second synchronization instruction according to the received global synchronization signal, where the second frequency clock sub-signal is included in the target clock signal, and the second synchronization instruction is included in the signal synchronization instruction.

The second frequency conversion unit 2012 is further configured to transmit the second synchronization instruction and the second frequency clock sub-signal to the second synchronization unit 2022.

The second synchronization unit 2022 is configured to perform, in response to the second synchronization instruction and based on the global synchronization signal, signal synchronization on the second frequency clock sub-signal through the at least one DFF included in the second synchronization unit 2022 to obtain a second synchronized clock sub-signal, where the second synchronized clock sub-signal is included in the synchronized clock signal.

The second synchronization unit 2022 is further configured to transmit the second synchronized clock sub-signal to the DAC channel 203, where the second synchronized clock sub-signal is a digital signal.

The DAC channel 203 is configured to convert the second synchronized clock sub-signal into an analog signal.

In this embodiment, by using an AWG included in the digital/analog mutual conversion devices as an example, the AWG includes a first frequency conversion unit and a second frequency conversion unit, where the first frequency conversion unit may be specifically a PLL and a VCO (PLL/VCO), and the second frequency conversion unit may be specifically a Div/Dly unit. Based on this, the signal synchronization module includes a first synchronization unit and a second synchronization unit, where the first frequency conversion unit may be placed inside the first synchronization unit, or the first frequency conversion unit and the first synchronization unit are in a communication connection. Similarly, the second frequency conversion unit may be placed inside the second synchronization unit, or the second frequency conversion unit and the second synchronization unit are in a communication connection.

Figure 6:
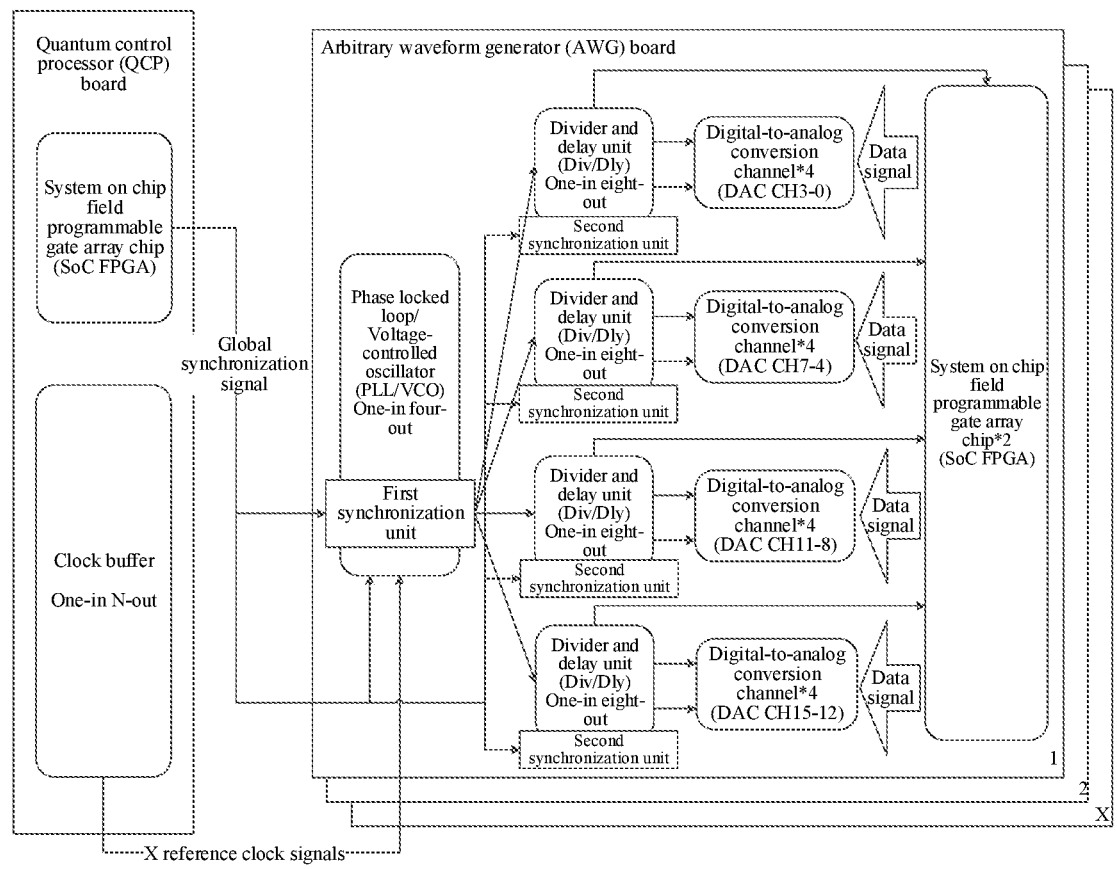
FIG. 6 is a schematic structural diagram of another clock synchronization system-based AWG according to an embodiment of this application.

Specifically, a description is made below by using an example in which the first frequency conversion unit is a PLL/VCO and the second frequency conversion unit is a Div/Dly unit. For ease of description, referring to FIG. 6, FIG. 6 is a schematic structural diagram of another clock synchronization system-based AWG according to an embodiment of this application. As shown in the figure, it is assumed that X AWGs are included, and each AWG corresponds to a reference clock signal, namely, there are X reference clock signals in total, where X is an integer greater than or equal to 1 and less than N. The PLL/VCO performs frequency conversion processing on the received reference clock signal to obtain a first frequency clock sub-signal and generates a first synchronization instruction according to the received global synchronization signal (Sync_GLB), and the PLL/VCO then transmits the first synchronization instruction and the first frequency clock sub-signal to the first synchronization unit. The first synchronization unit performs, in response to the first synchronization instruction, signal synchronization on the first frequency clock sub-signal by using a DFF according to the global synchronization signal (Sync_GLB), to output a first synchronized clock sub-signal.

The first synchronization unit transmits the first synchronized clock sub-signal to the Div/Dly unit. The Div/Dly unit performs frequency conversion processing and delay processing on the received first synchronized clock sub-signal, to obtain a second frequency clock sub-signal, and generates a second synchronization instruction according to the received global synchronization signal (Sync_GLB). The Div/Dly unit then transmits the second synchronization instruction and the second frequency clock sub-signal to the second synchronization unit. The second synchronization unit performs, in response to the second synchronization instruction, signal synchronization on the second frequency clock sub-signal by using a DFF according to the global synchronization signal (Sync_GLB), to output a second synchronized clock sub-signal.

The second synchronization unit finally transmits the second synchronized clock sub-signal to the DAC channel, where the second synchronized clock sub-signal is a digital signal. Each Div/Dly unit shown in FIG. 6 corresponds to 4 DAC channels, and each DAC channel includes two inputs. The DAC channel converts the second synchronized clock sub-signal into an analog signal.

For the PLL/VCO, an input of the DFF is the global synchronization signal (Sync_GLB), and the target clock signal is an output clock of the VCO. For the Div/Dly unit, the target clock signal is an input clock, and a new synchronized clock signal is generated after one level of DFF or a plurality of levels of DFFs for synchronizing an output of an internal distributor.

Moreover, in the embodiments of this application, a clock synchronization system is provided. According to the foregoing system, a configurable second frequency conversion unit, namely, a Div/Dly unit is added to an output end of each DAC channel, so that a phase of a signal outputted by each DAC channel is independent and adjustable, thereby reducing an inter-channel phase skew caused by wiring and component differences between printed circuit boards (PCBs).

Figure 7:
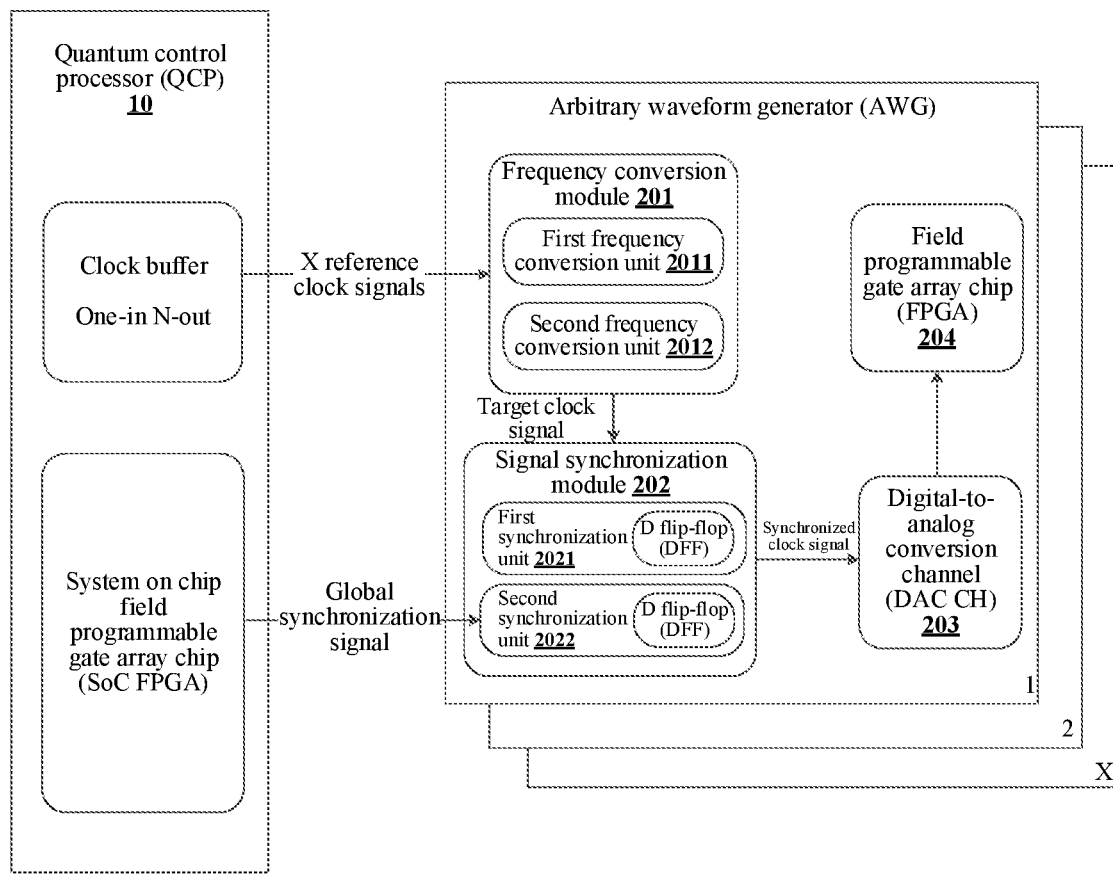
FIG. 7 is a schematic structural diagram of another clock synchronization system-based AWG according to an embodiment of this application.

In some embodiments, based on the embodiment corresponding to FIG. 3, further referring to FIG. 7, FIG. 7 is a schematic structural diagram of another clock synchronization system-based AWG according to an embodiment of this application. With reference to FIG. 3 and FIG. 7, in another embodiment of the clock synchronization system according to an embodiment of this application, the AWG further includes an FPGA chip 204.

The second synchronization unit 2022 is further configured to transmit the second synchronized clock sub-signal to the FPGA chip 204.

The FPGA chip 204 is configured to transmit a data signal to the DAC channel 203 according to the second synchronized clock sub-signal.

In this embodiment, by using an AWG included in the digital/analog mutual conversion devices as an example, the AWG includes a first frequency conversion unit and a second frequency conversion unit, where the first frequency conversion unit may be specifically a PLL and a VCO (PLL/VCO), and the second frequency conversion unit may be specifically a Div/Dly unit. Based on this, the signal synchronization module includes a first synchronization unit and a second synchronization unit, where the first frequency conversion unit may be placed inside the first synchronization unit, or the first frequency conversion unit and the first synchronization unit are in a communication connection. Similarly, the second frequency conversion unit may be placed inside the second synchronization unit, or the second frequency conversion unit and the second synchronization unit are in a communication connection.

Based on this, a description is made below by using an example in which the first frequency conversion unit is a PLL/VCO and the second frequency conversion unit is a Div/Dly unit. For ease of description, referring to FIG. 6 again, FIG. 6 is a schematic structural diagram of another clock synchronization system-based AWG according to an embodiment of this application. As shown in the figure, the second synchronization unit may further transmit a second synchronized clock sub-signal on which frequency conversion processing has been performed to the FPGA chip, and the FPGA chip determines, based on the second synchronized clock sub-signal, that clock synchronization has been completed by now, and therefore transmits a data signal to the DAC channel.

Further, in the embodiments of this application, a clock synchronization system is provided. According to the foregoing system, the Div/Dly unit can implement frequency conversion processing, so that a signal on which frequency conversion processing has been performed may be further transmitted to the FPGA chip without disposing another component for frequency conversion processing, thereby enhancing an integration effect.

Figure 8:
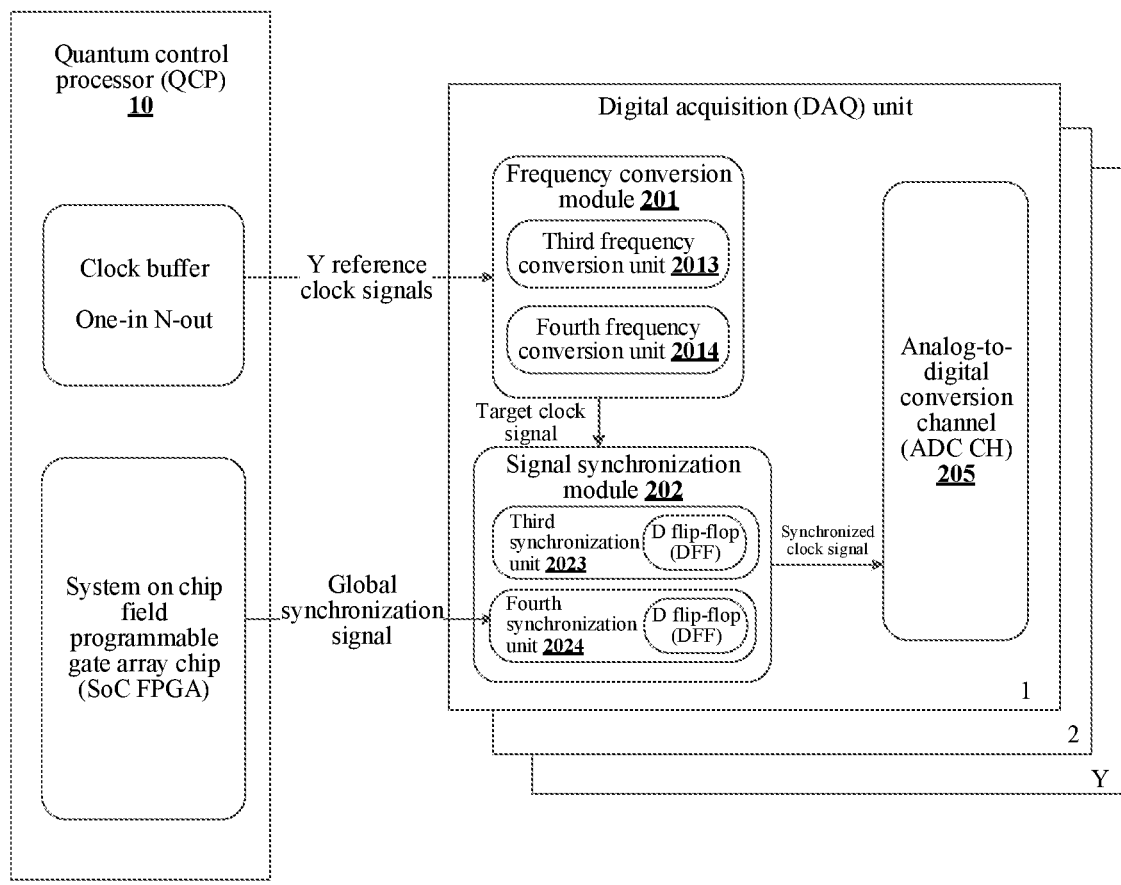
FIG. 8 is a schematic structural diagram of a clock synchronization system-based digital acquisition (DAQ) unit according to an embodiment of this application.

In some embodiments, based on the embodiment corresponding to FIG. 3, further referring to FIG. 8, FIG. 8 is a schematic structural diagram of a clock synchronization system-based DAQ unit according to an embodiment of this application. With reference to FIG. 3 and FIG. 8, in another embodiment of the clock synchronization system according to an embodiment of this application, the N digital/analog mutual conversion devices 20 include a DAQ unit, the DAQ unit belongs to the digital/analog mutual conversion devices 20, the DAQ unit includes an ADC channel 205, the frequency conversion module 201 includes a third frequency conversion unit 2013 and a fourth frequency conversion unit 2014, the signal synchronization module 202 includes a third synchronization unit 2023 and a fourth synchronization unit 2024, the third synchronization unit 2023 includes at least one DFF, and the fourth synchronization unit 2024 includes at least one DFF.

The third frequency conversion unit 2013 is configured to perform frequency conversion processing on the received reference clock signal to obtain a third frequency clock sub-signal and generate a third synchronization instruction according to the received global synchronization signal, where the third frequency clock sub-signal is included in the target clock signal, and the third synchronization instruction is included in the signal synchronization instruction.

The third frequency conversion unit 2013 is further configured to transmit the third synchronization instruction and the third frequency clock sub-signal to the third synchronization unit.

The third synchronization unit 2023 is configured to perform, in response to the third synchronization instruction and based on the global synchronization signal, signal synchronization on the third frequency clock sub-signal through the at least one DFF included in the third synchronization unit 2023 to obtain a third synchronized clock sub-signal, where the third synchronized clock sub-signal is included in the synchronized clock signal.

The third synchronization unit 2023 is further configured to transmit the third synchronized clock sub-signal to the fourth frequency conversion unit 2014.

The fourth frequency conversion unit 2014 is configured to perform frequency conversion processing and delay processing on the received third synchronized clock sub-signal to obtain a fourth frequency clock sub-signal and generate a fourth synchronization instruction according to the received global synchronization signal, where the fourth frequency clock sub-signal is included in the target clock signal, and the fourth synchronization instruction is included in the signal synchronization instruction.

The fourth frequency conversion unit 2014 is further configured to transmit the fourth synchronization instruction and the fourth frequency clock sub-signal to the fourth synchronization unit 2024.

The fourth synchronization unit 2024 is configured to perform, in response to the fourth synchronization instruction and based on the global synchronization signal, signal synchronization on the fourth frequency clock sub-signal through the at least one DFF included in the fourth synchronization unit 2024 to obtain a fourth synchronized clock sub-signal, where the fourth synchronized clock sub-signal is included in the synchronized clock signal.

The fourth synchronization unit 2024 is further configured to transmit the fourth synchronized clock sub-signal to the ADC channel 205, where the fourth synchronized clock sub-signal is an analog signal.

The ADC channel 205 is configured to convert the fourth synchronized clock sub-signal into a digital signal.

In this embodiment, by using a DAQ unit included in the digital/analog mutual conversion devices as an example, the DAQ unit includes a third frequency conversion unit and a fourth frequency conversion unit, where the third frequency conversion unit may be specifically a PLL/VCO, and the fourth frequency conversion unit may be specifically a Div/Dly unit. Based on this, the signal synchronization module includes a third synchronization unit and a fourth synchronization unit, where the third frequency conversion unit may be placed inside the third synchronization unit, or the third frequency conversion unit and the third synchronization unit are in a communication connection. Similarly, the fourth frequency conversion unit may be placed inside the fourth synchronization unit, or the fourth frequency conversion unit and the fourth synchronization unit are in a communication connection.

Figure 9:
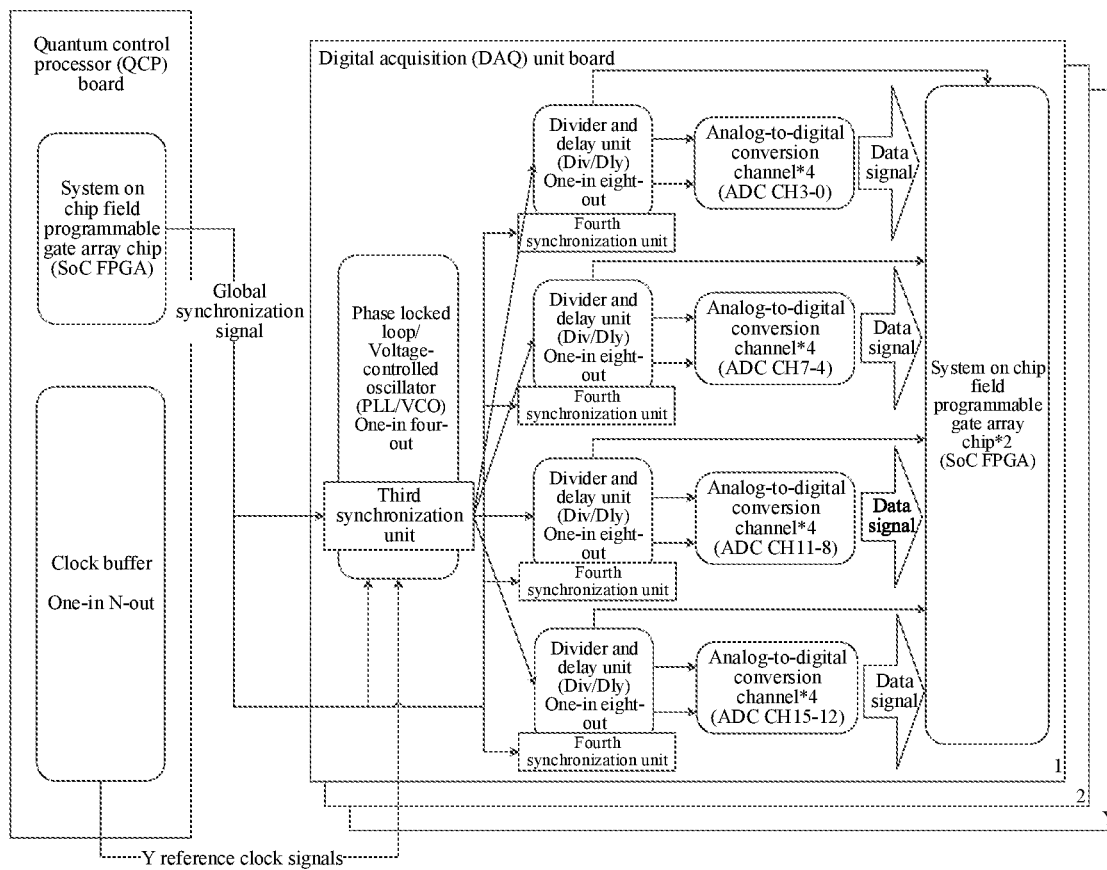
FIG. 9 is a schematic structural diagram of another clock synchronization system-based DAQ unit according to an embodiment of this application.

Specifically, a description is made below by using an example in which the third frequency conversion unit is a PLL/VCO and the fourth frequency conversion unit is a Div/Dly unit. For ease of description, referring to FIG. 9, FIG. 9 is a schematic structural diagram of another clock synchronization system-based DAQ unit according to an embodiment of this application. As shown in the figure, it is assumed that Y DAQ units are included, and each DAQ unit corresponds to a reference clock signal, namely, there are Y reference clock signals in total, where Y is an integer greater than or equal to 1 and less than N. The PLL/VCO performs frequency conversion processing on the received reference clock signal to obtain a third frequency clock sub-signal and generates a third synchronization instruction according to the received global synchronization signal (Sync_GLB), and the PLL/VCO then transmits the third synchronization instruction and the third frequency clock sub-signal to the third synchronization unit. The third synchronization unit performs, in response to the third synchronization instruction, signal synchronization on the third frequency clock sub-signal by using a DFF according to the global synchronization signal (Sync_GLB), to output a third synchronized clock sub-signal.

The third synchronization unit transmits the third synchronized clock sub-signal to the Div/Dly unit. The Div/Dly unit performs frequency conversion processing and delay processing on the received third synchronized clock sub-signal, to obtain a fourth frequency clock sub-signal, and generates a fourth synchronization instruction according to the received global synchronization signal (Sync_GLB). The Div/Dly unit then transmits the fourth synchronization instruction and the fourth frequency clock sub-signal to the fourth synchronization unit. The fourth synchronization unit performs, in response to the fourth synchronization instruction, signal synchronization on the fourth frequency clock sub-signal by using a DFF according to the global synchronization signal (Sync_GLB), to output a fourth synchronized clock sub-signal.

The fourth synchronization unit finally transmits the fourth synchronized clock sub-signal to the ADC channel, where the fourth synchronized clock sub-signal is an analog signal. Each Div/Dly unit shown in FIG. 9 corresponds to 4 ADC channels, and each ADC channel includes two inputs. The ADC channel converts the fourth synchronized clock sub-signal into a digital signal.

For the PLL/VCO, an input of the DFF is the global synchronization signal (Sync_GLB), and the target clock signal is an output clock of the VCO. For the Div/Dly unit, the target clock signal is an input clock, and a new synchronized clock signal is generated after one level of DFF or a plurality of levels of DFFs for synchronizing an output of an internal distributor.

Moreover, in the embodiments of this application, a clock synchronization system is provided. According to the foregoing system, a configurable fourth frequency conversion unit, namely, a Div/Dly unit is added to an output end of each ADC channel, so that a phase of a signal outputted by each ADC channel is independent and adjustable, thereby reducing an inter-channel phase skew caused by wiring and component differences between PCBs.

Figure 10:
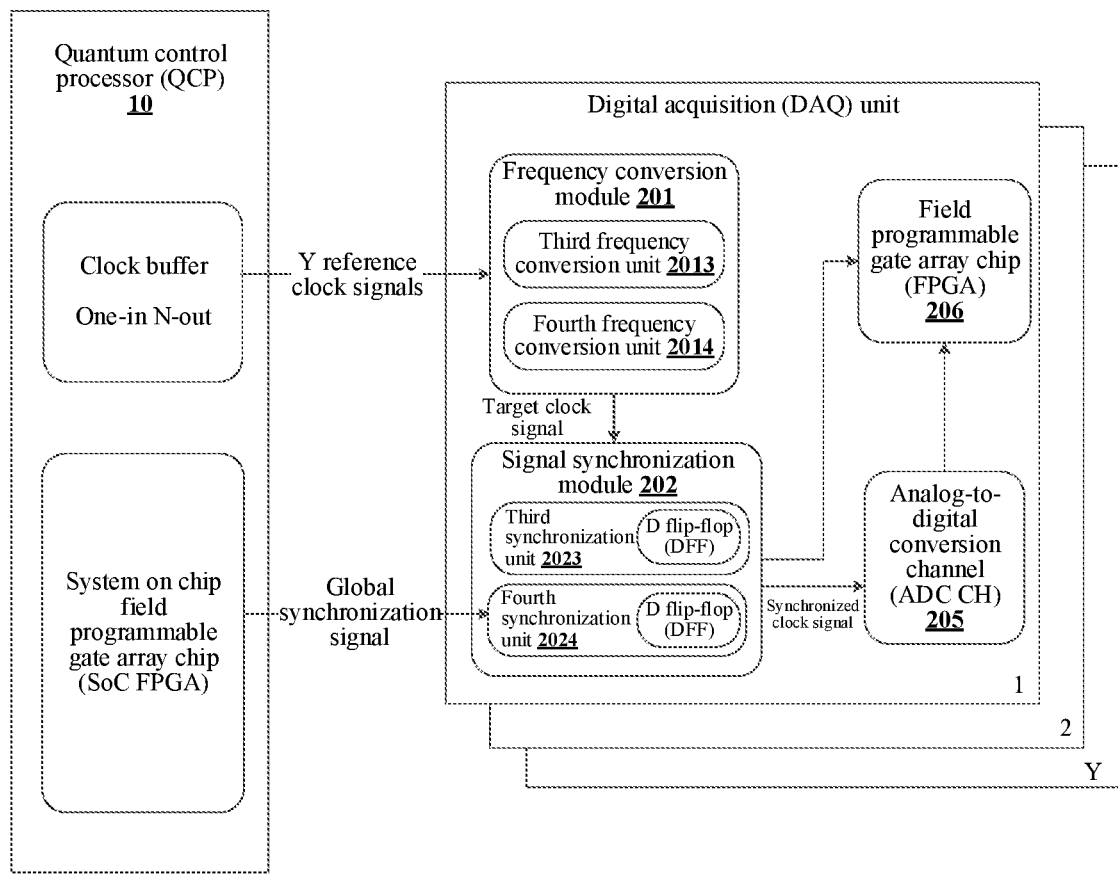
FIG. 10 is a schematic structural diagram of another clock synchronization system-based DAQ unit according to an embodiment of this application.

In some embodiments, based on the embodiment corresponding to FIG. 3, further referring to FIG. 10, FIG. 10 is a schematic structural diagram of another clock synchronization system-based DAQ unit according to an embodiment of this application. With reference to FIG. 3 and FIG. 10, in another embodiment of the clock synchronization system according to an embodiment of this application, the DAQ unit further includes an FPGA chip 206.

The fourth synchronization unit 2024 is further configured to transmit the fourth synchronized clock sub-signal to the FPGA chip 206.

The FPGA chip 206 is configured to receive, according to the fourth synchronized clock sub-signal, a data signal transmitted by the ADC channel 205.

In this embodiment, by using a DAQ unit included in the digital/analog mutual conversion devices as an example, the DAQ unit includes a third frequency conversion unit and a fourth frequency conversion unit, where the third frequency conversion unit may be specifically a PLL/VCO, and the fourth frequency conversion unit may be specifically a Div/Dly unit. Based on this, the signal synchronization module includes a third synchronization unit and a fourth synchronization unit, where the third frequency conversion unit may be placed inside the third synchronization unit, or the third frequency conversion unit and the third synchronization unit are in a communication connection. Similarly, the fourth frequency conversion unit may be placed inside the fourth synchronization unit, or the fourth frequency conversion unit and the fourth synchronization unit are in a communication connection.

Based on this, a description is made below by using an example in which the third frequency conversion unit is a PLL/VCO and the fourth frequency conversion unit is a Div/Dly unit. For ease of description, referring to FIG. 10 again, FIG. 10 is a schematic structural diagram of another clock synchronization system-based DAQ unit according to an embodiment of this application. As shown in the figure, the fourth synchronization unit may further transmit a fourth synchronized clock sub-signal on which frequency conversion processing has been performed to the FPGA chip, and the FPGA chip determines, based on the fourth synchronized clock sub-signal, that clock synchronization has been completed by now, and therefore can receive a data signal transmitted by the ADC channel.

Further, in the embodiments of this application, a clock synchronization system is provided. According to the foregoing system, the Div/Dly unit can implement frequency conversion processing, so that a signal on which frequency conversion processing has been performed may be further transmitted to the FPGA chip without disposing another component for frequency conversion processing, thereby enhancing an integration effect.

Figure 11:
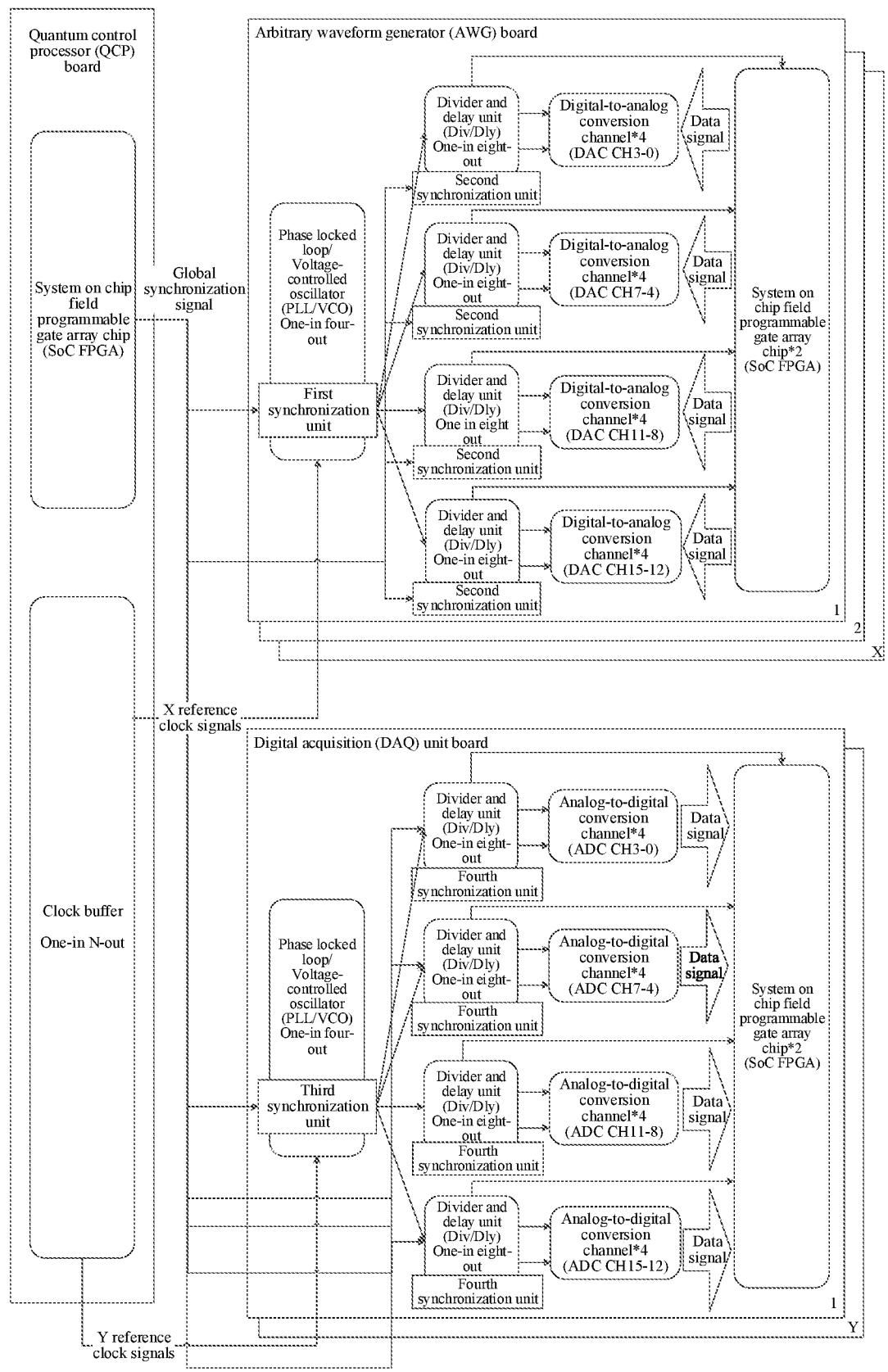
FIG. 11 is a schematic structural diagram of another clock synchronization system according to an embodiment of this application.

With reference to the foregoing embodiments, referring to FIG. 11, FIG. 11 is a schematic structural diagram of another clock synchronization system according to an embodiment of this application. As shown in the figure, specifically, A QCP transmits a reference clock signal to a PLL/VCO, to generate a new frequency clock, and a Div/Dly unit then performs frequency division and delay regulation. The new frequency clock is finally inputted into a DAC channel, an ADC channel, and an FPGA chip. The QCP distributes a global synchronization signal (Sync_GLB) to a PLL/VCO and a Div/Dly unit in an AWG, and the QCP distributes the global synchronization signal (Sync_GLB) to a PLL/VCO and a Div/Dly unit in a DAQ unit, to drive corresponding signal synchronization modules.

Based on the clock synchronization system shown in FIG. 11, a working manner and a signal transmission direction of each part have been described in the foregoing embodiments, and therefore details are not described herein again.

Figure 12:
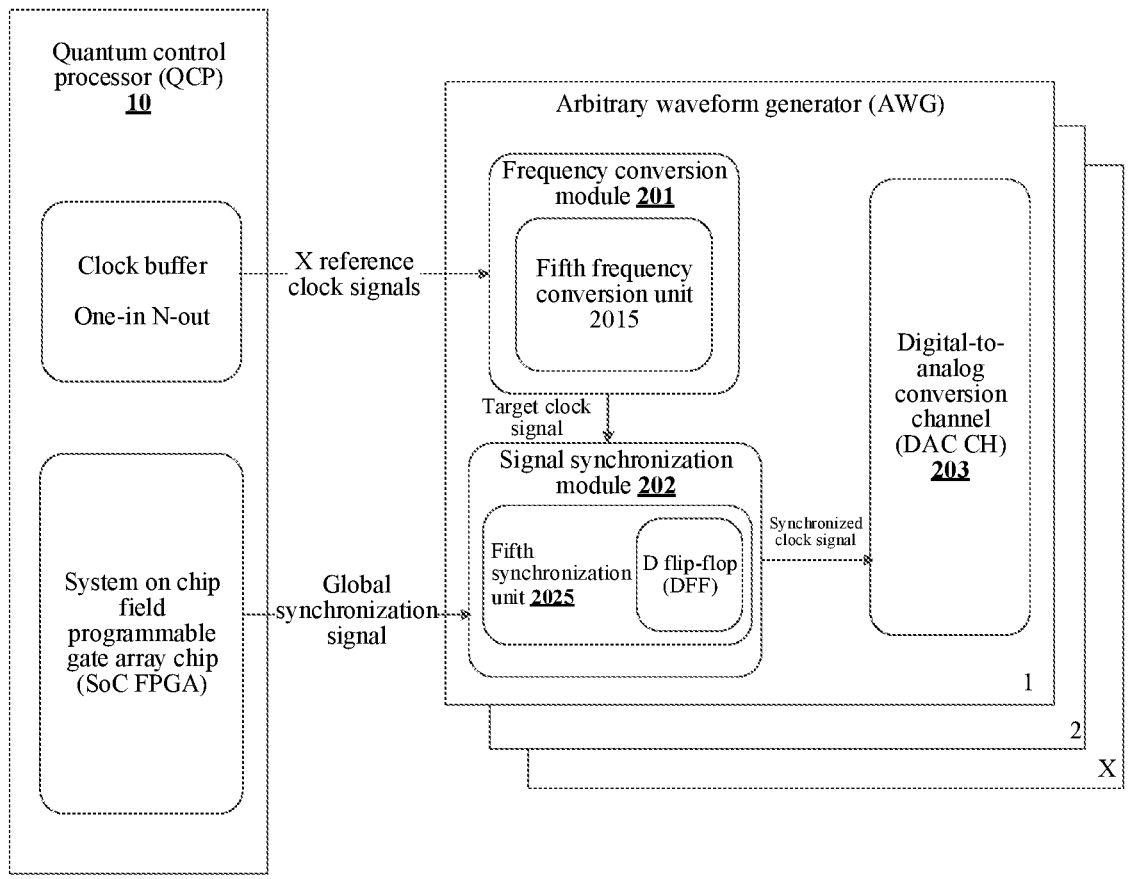
FIG. 12 is a schematic structural diagram of another clock synchronization system-based AWG according to an embodiment of this application.

In some embodiments, based on the embodiment corresponding to FIG. 3, further referring to FIG. 12, FIG. 12 is a schematic structural diagram of another clock synchronization system-based AWG according to an embodiment of this application. With reference to FIG. 3 and FIG. 12, in another embodiment of the clock synchronization system according to an embodiment of this application, the N digital/analog mutual conversion devices 20 include an AWG, the AWG belongs to the digital/analog mutual conversion devices 20, the AWG includes a DAC channel 203, the frequency conversion module 201 includes a fifth frequency conversion unit 2015, the signal synchronization module 202 includes a fifth synchronization unit 2025, and the fifth synchronization unit 2025 includes at least one DFF.

The fifth frequency conversion unit 2015 is configured to perform frequency conversion processing and PLL processing on the received reference clock signal to obtain a fifth frequency clock sub-signal and generate a fifth synchronization instruction according to the received global synchronization signal, where the fifth frequency clock sub-signal is included in the target clock signal, and the fifth synchronization instruction is included in the signal synchronization instruction.

The fifth frequency conversion unit 2015 is further configured to transmit the fifth synchronization instruction and the fifth frequency clock sub-signal to the fifth synchronization unit 2025.

The fifth synchronization unit 2025 is configured to perform, in response to the fifth synchronization instruction and based on the global synchronization signal, signal synchronization on the fifth frequency clock sub-signal through the at least one DFF included in the fifth synchronization unit 2025 to obtain a fifth synchronized clock sub-signal, where the fifth synchronized clock sub-signal is included in the synchronized clock signal.

The fifth synchronization unit 2025 is further configured to transmit the fifth synchronized clock sub-signal to the DAC channel 203, where the fifth synchronized clock sub-signal is a digital signal.

The DAC channel 203 is configured to convert the fifth synchronized clock sub-signal into an analog signal.

In this embodiment, by using an AWG included in the digital/analog mutual conversion devices as an example, the AWG includes a fifth synchronization unit, where the fifth synchronization unit may be specifically a PLL/VCO. Based on this, the signal synchronization module includes a fifth synchronization unit, where the fifth frequency conversion unit may be placed inside the fifth synchronization unit, or the fifth frequency conversion unit and the fifth synchronization unit are in a communication connection.

Figure 13:
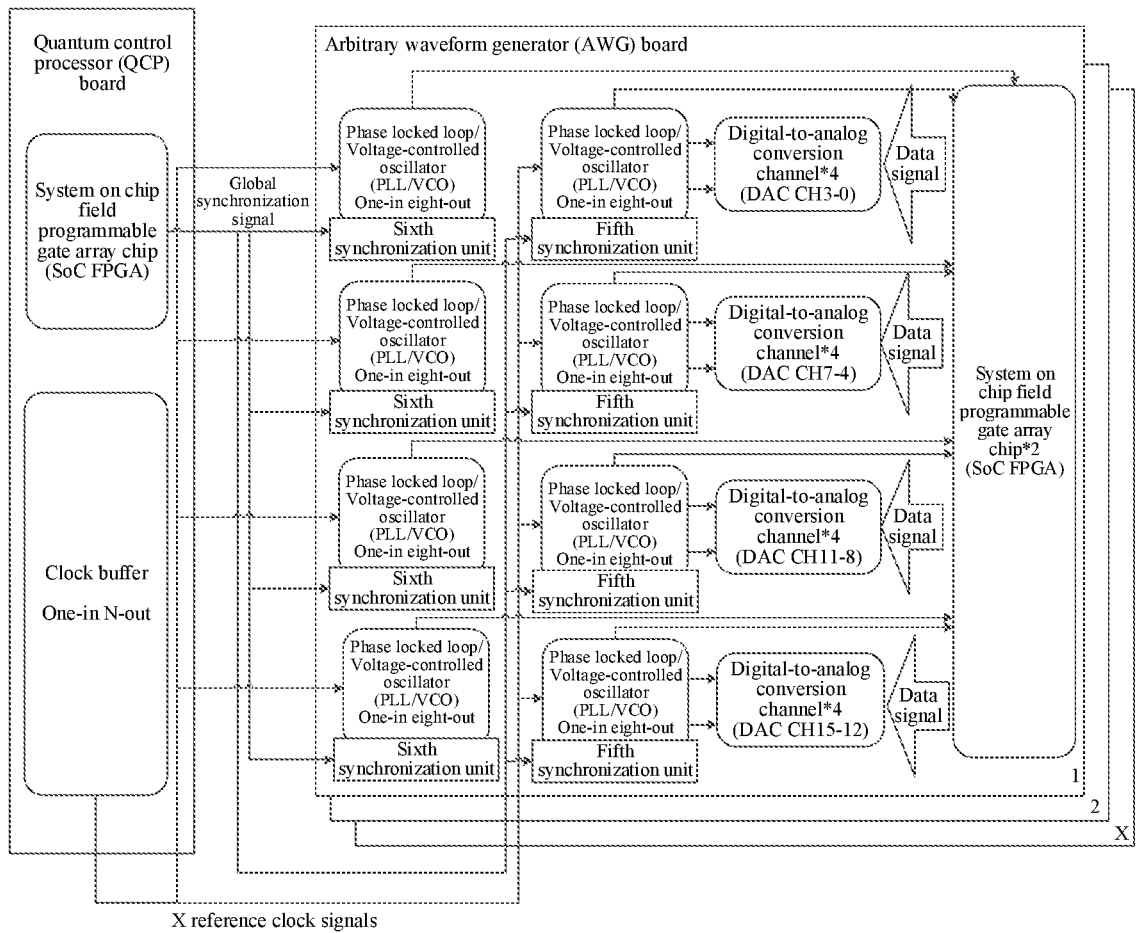
FIG. 13 is a schematic structural diagram of another clock synchronization system-based AWG according to an embodiment of this application.

Specifically, a description is made below by using an example in which the fifth frequency conversion unit is a PLL/VCO. For ease of description, referring to FIG. 13, FIG. 13 is a schematic structural diagram of another clock synchronization system-based AWG according to an embodiment of this application. As shown in the figure, it is assumed that X AWGs are included, and each AWG corresponds to a reference clock signal, namely, there are X reference clock signals in total, where X is an integer greater than or equal to 1 and less than N. The PLL/VCO performs frequency conversion processing on the received reference clock signal to obtain a fifth frequency clock sub-signal and generates a fifth synchronization instruction according to the received global synchronization signal (Sync_GLB), and the PLL/VCO then transmits the fifth synchronization instruction and the fifth frequency clock sub-signal to the fifth synchronization unit. The fifth synchronization unit performs, in response to the fifth synchronization instruction, signal synchronization on the fifth frequency clock sub-signal by using a DFF according to the global synchronization signal (Sync_GLB), to output a fifth synchronized clock sub-signal.

The fifth synchronization unit transmits the fifth synchronized clock sub-signal to the DAC channel, where the fifth synchronized clock sub-signal is a digital signal. Each fifth synchronization unit shown in FIG. 13 corresponds to 4 DAC channels, and each DAC channel includes two inputs. The DAC channel converts the fifth synchronized clock sub-signal into an analog signal.

For the PLL/VCO, an input of the DFF is the global synchronization signal (Sync_GLB), and the target clock signal is an output clock of the VCO.

Moreover, in the embodiments of this application, a clock synchronization system is provided. According to the foregoing system, a plurality of PLLs/VCOs are added to an output end of each DAC channel for implementing frequency division processing, thereby adjusting a signal frequency and providing a feasible implementation for clock synchronization.

Figure 14:
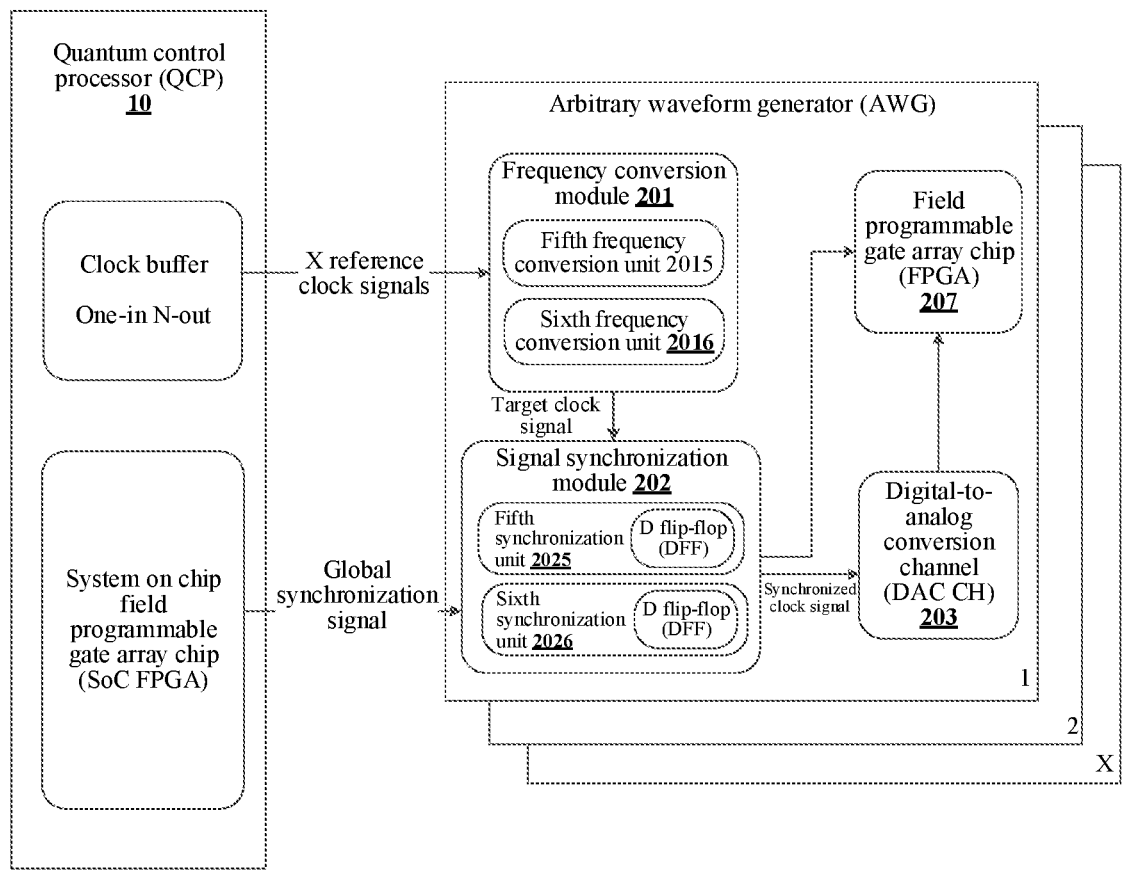
FIG. 14 is a schematic structural diagram of another clock synchronization system-based AWG according to an embodiment of this application.

In some embodiments, based on the embodiment corresponding to FIG. 3, further referring to FIG. 14, FIG. 14 is a schematic structural diagram of another clock synchronization system-based AWG according to an embodiment of this application. With reference to FIG. 3 and FIG. 14, in another embodiment of the clock synchronization system according to an embodiment of this application, the AWG further includes an FPGA chip 207, the frequency conversion module 201 further includes a sixth frequency conversion unit 2016, the signal synchronization module 202 further includes a sixth synchronization unit 2026, and the sixth synchronization unit 2026 includes at least one DFF.

The sixth frequency conversion unit 2016 is configured to perform frequency conversion processing and PLL processing on the received reference clock signal to obtain a sixth frequency clock sub-signal and generate a sixth synchronization instruction according to the received global synchronization signal, where the sixth frequency clock sub-signal is included in the target clock signal, and the sixth synchronization instruction is included in the signal synchronization instruction.

The sixth frequency conversion unit 2016 is further configured to transmit the sixth synchronization instruction and the sixth frequency clock sub-signal to the sixth synchronization unit 2026.

The sixth synchronization unit 2026 is configured to perform, in response to the sixth synchronization instruction and based on the global synchronization signal, signal synchronization on the sixth frequency clock sub-signal through the at least one DFF included in the sixth synchronization unit 2016 to obtain a sixth synchronized clock sub-signal, where the sixth synchronized clock sub-signal is included in the synchronized clock signal.

The sixth synchronization unit 2026 is further configured to transmit the sixth synchronized clock sub-signal to the FPGA chip 207.

The FPGA chip 207 is configured to transmit a data signal to the DAC channel 203 according to the sixth synchronized clock sub-signal.

In this embodiment, by using an AWG included in the digital/analog mutual conversion devices as an example, the AWG includes a fifth synchronization unit and a sixth synchronization unit, where both the fifth synchronization unit and the sixth synchronization unit may be specifically a PLL/VCO. Based on this, the signal synchronization module includes a fifth synchronization unit and a sixth synchronization unit, where the fifth frequency conversion unit may be placed inside the fifth synchronization unit, or the fifth frequency conversion unit and the fifth synchronization unit are in a communication connection. Similarly, the sixth frequency conversion unit may be placed inside the sixth synchronization unit, or the sixth frequency conversion unit and the sixth synchronization unit are in a communication connection.

Specifically, a description is made below by using an example in which both the fifth frequency conversion unit and the sixth frequency conversion unit are a PLL/VCO. For ease of description, referring to FIG. 13 again, FIG. 13 is a schematic structural diagram of another clock synchronization system-based AWG according to an embodiment of this application. As shown in the figure, it is assumed that X AWGs are included, and each AWG corresponds to a reference clock signal, namely, there are X reference clock signals in total, where X is an integer greater than or equal to 1 and less than N. As can be known from the foregoing embodiments, the PLL/VCO corresponding to the fifth synchronization unit performs frequency conversion processing on the received reference clock signal to obtain a fifth frequency clock sub-signal and generates a fifth synchronization instruction according to the received global synchronization signal (Sync_GLB), and the PLL/VCO corresponding to the fifth synchronization unit then transmits the fifth synchronization instruction and the fifth frequency clock sub-signal to the fifth synchronization unit. The fifth synchronization unit performs, in response to the fifth synchronization instruction, signal synchronization on the fifth frequency clock sub-signal by using a DFF according to the global synchronization signal (Sync_GLB), to output a fifth synchronized clock sub-signal.

Similarly, the PLL/VCO corresponding to the sixth synchronization unit performs frequency conversion processing on the received reference clock signal to obtain a sixth frequency clock sub-signal and generates a sixth synchronization instruction according to the received global synchronization signal (Sync_GLB), and the PLL/VCO corresponding to the sixth synchronization unit then transmits the sixth synchronization instruction and the sixth frequency clock sub-signal to the sixth synchronization unit. The sixth synchronization unit performs, in response to the sixth synchronization instruction, signal synchronization on the sixth frequency clock sub-signal by using a DFF according to the global synchronization signal (Sync_GLB), to output a sixth synchronized clock sub-signal.

The fifth synchronized clock sub-signal and the sixth synchronized clock sub-signal have different frequencies. The fifth synchronization unit transmits the fifth synchronized clock sub-signal to the DAC channel, where the fifth synchronized clock sub-signal is a digital signal. The sixth synchronization unit transmits the sixth synchronized clock sub-signal to the FPGA chip. The FPGA chip determines, based on the sixth synchronized clock sub-signal, that clock synchronization has been completed by now, and therefore transmits a data signal to the DAC channel.

Further, in the embodiments of this application, a clock synchronization system is provided. According to the foregoing system, a plurality of PLLs/VCOs are used to implement frequency conversion processing. Therefore, a signal on which frequency conversion processing has been performed may be further transmitted to the FPGA chip, to improve the feasibility and operability of the solution.

Figure 15:
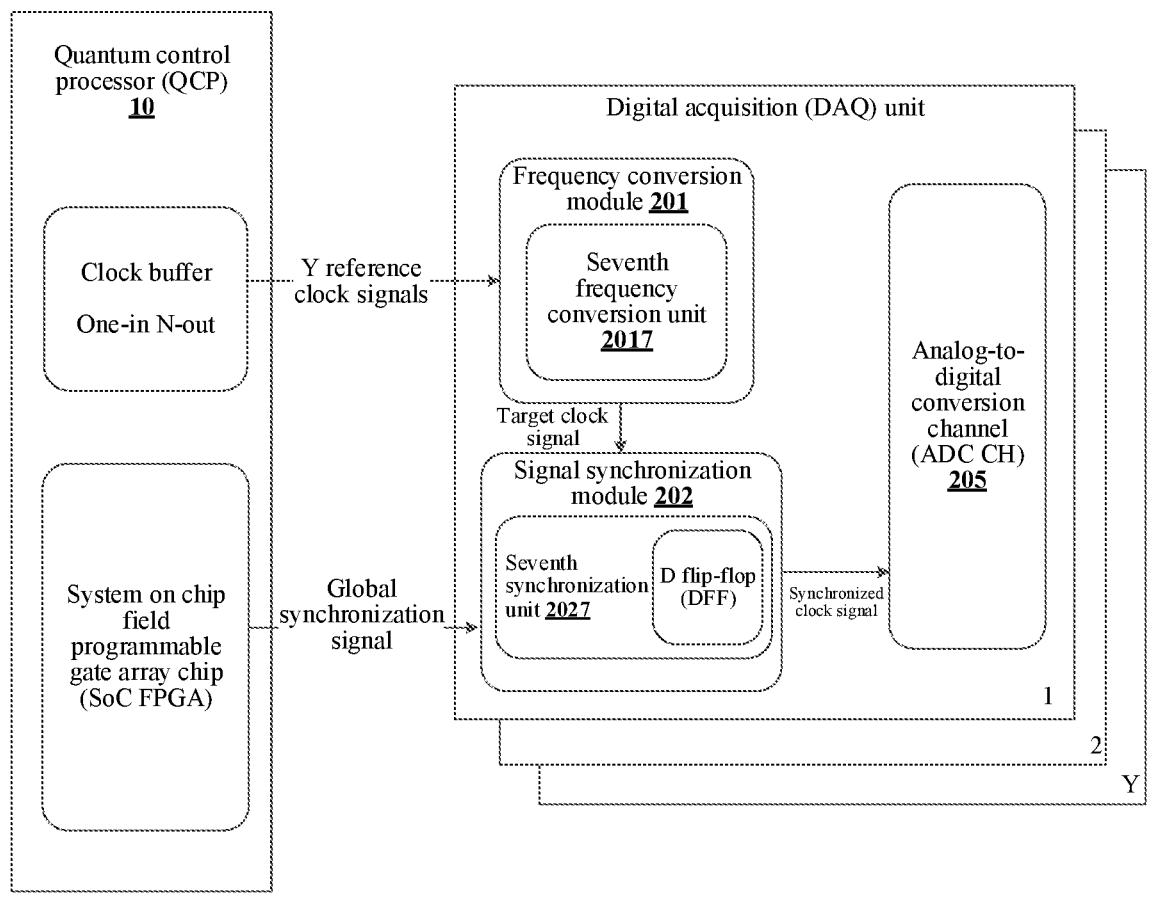
FIG. 15 is a schematic structural diagram of another clock synchronization system-based DAQ unit according to an embodiment of this application.

In some embodiments, based on the embodiment corresponding to FIG. 3, further referring to FIG. 15, FIG. 15 is a schematic structural diagram of another clock synchronization system-based DAQ unit according to an embodiment of this application. With reference to FIG. 3 and FIG. 15, in another embodiment of the clock synchronization system according to an embodiment of this application, the N digital/analog mutual conversion devices 20 include a DAQ unit, the DAQ unit belongs to the digital/analog mutual conversion devices 20, the DAQ unit includes an ADC channel 205, the frequency conversion module 201 includes a seventh frequency conversion unit 2017, the signal synchronization module 202 includes a seventh synchronization unit 2027, and the seventh synchronization unit 2027 includes at least one DFF.

The seventh frequency conversion unit 2017 is configured to perform frequency conversion processing and PLL processing on the received reference clock signal to obtain a seventh frequency clock sub-signal and generate a seventh synchronization instruction according to the received global synchronization signal, where the seventh frequency clock sub-signal is included in the target clock signal, and the seventh synchronization instruction is included in the signal synchronization instruction.

The seventh frequency conversion unit 2017 is further configured to transmit the seventh synchronization instruction and the seventh frequency clock sub-signal to the seventh synchronization unit 2027.

The seventh synchronization unit 2027 is configured to perform, in response to the seventh synchronization instruction and based on the global synchronization signal, signal synchronization on the seventh frequency clock sub-signal through the at least one DFF included in the seventh synchronization unit 2027 to obtain a seventh synchronized clock sub-signal, where the seventh synchronized clock sub-signal is included in the synchronized clock signal.

The seventh synchronization unit 2027 is further configured to transmit the seventh synchronized clock sub-signal to the ADC channel 205, where the seventh synchronized clock sub-signal is an analog signal.

The ADC channel 205 is configured to convert the seventh synchronized clock sub-signal into a digital signal.

In this embodiment, by using a DAQ unit included in the digital/analog mutual conversion devices as an example, the DAQ unit includes a seventh synchronization unit, where the seventh synchronization unit may be specifically a PLL/VCO. Based on this, the signal synchronization module includes a seventh synchronization unit, where the seventh frequency conversion unit may be placed inside the seventh synchronization unit, or the seventh frequency conversion unit and the seventh synchronization unit are in a communication connection.

Figure 16:
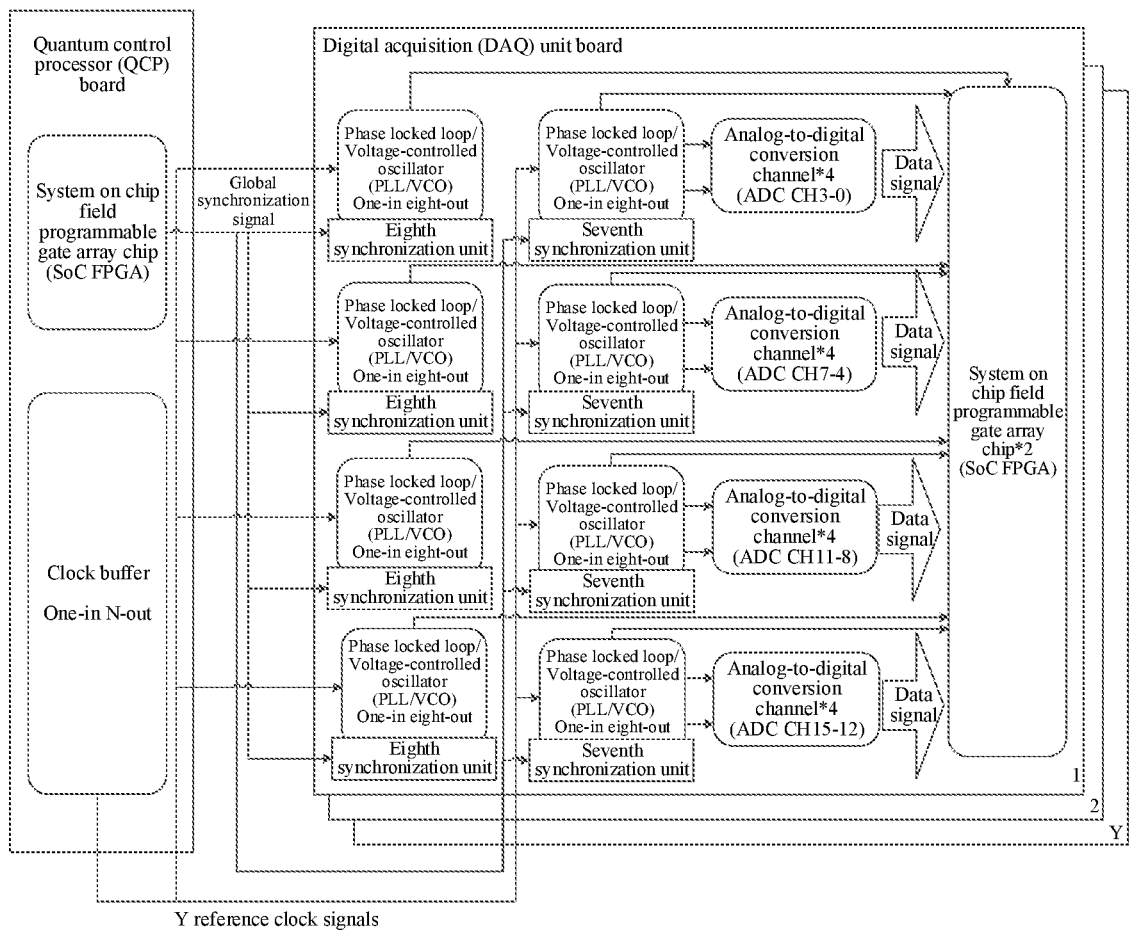
FIG. 16 is a schematic structural diagram of another clock synchronization system-based DAQ unit according to an embodiment of this application.

Specifically, a description is made below by using an example in which the seventh frequency conversion unit is a PLL/VCO. For ease of description, referring to FIG. 16, FIG. 16 is a schematic structural diagram of another clock synchronization system-based DAQ unit according to an embodiment of this application. As shown in the figure, it is assumed that Y DAQ units are included, and each DAQ unit corresponds to a reference clock signal, namely, there are Y reference clock signals in total, where Y is an integer greater than or equal to 1 and less than N. The PLL/VCO performs frequency conversion processing on the received reference clock signal to obtain a seventh frequency clock sub-signal and generates a seventh synchronization instruction according to the received global synchronization signal (Sync_GLB), and the PLL/VCO then transmits the seventh synchronization instruction and the seventh frequency clock sub-signal to the seventh synchronization unit. The seventh synchronization unit performs, in response to the seventh synchronization instruction, signal synchronization on the seventh frequency clock sub-signal by using a DFF according to the global synchronization signal (Sync_GLB), to output a seventh synchronized clock sub-signal.

The seventh synchronization unit transmits the seventh synchronized clock sub-signal to the ADC channel, where the seventh synchronized clock sub-signal is an analog signal. Each seventh synchronization unit shown in FIG. 16 corresponds to 4 ADC channels, and each ADC channel includes two inputs. The ADC channel converts the seventh synchronized clock sub-signal into a digital signal.

For the PLL/VCO, an input of the DFF is the global synchronization signal (Sync_GLB), and the target clock signal is an output clock of the VCO.

Moreover, in the embodiments of this application, a clock synchronization system is provided. According to the foregoing system, a plurality of PLLs/VCOs are added to an output end of each ADC channel for implementing frequency division processing, thereby adjusting a signal frequency and providing a feasible implementation for clock synchronization.

Figure 17:
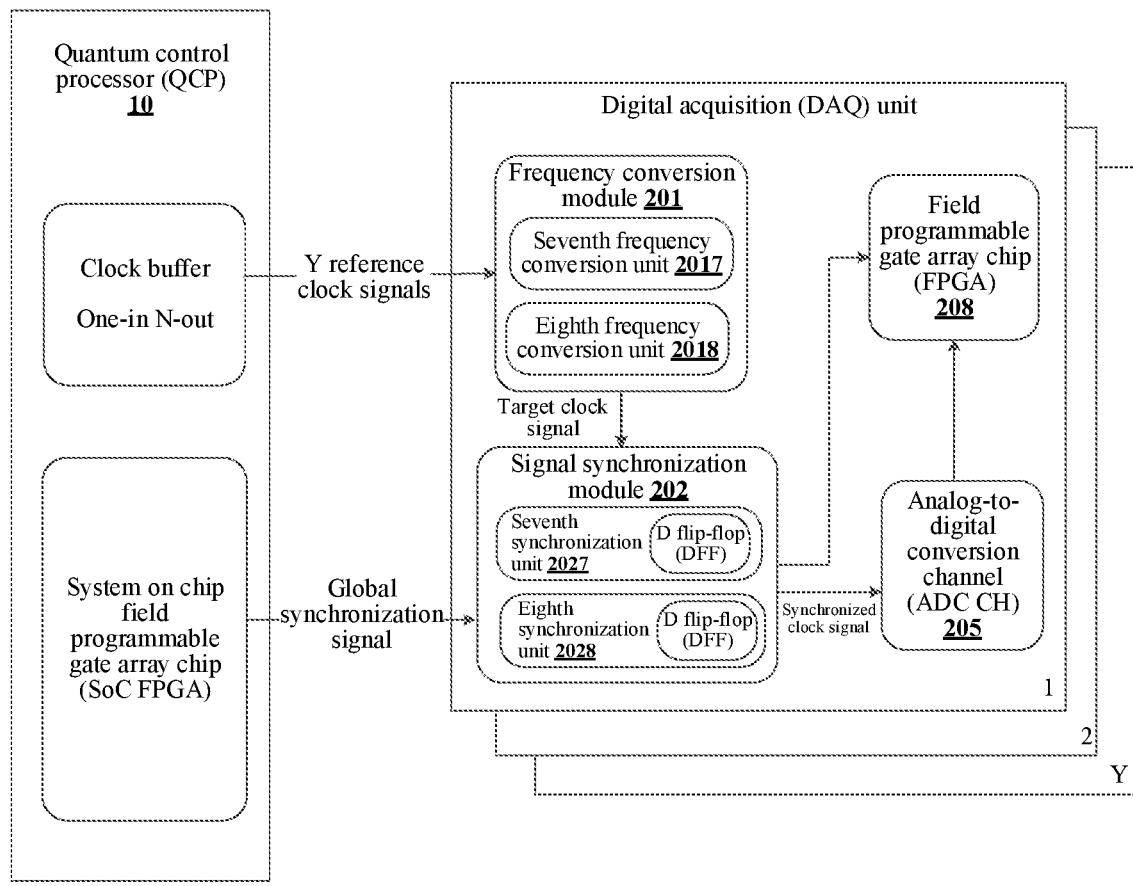
FIG. 17 is a schematic structural diagram of another clock synchronization system-based DAQ unit according to an embodiment of this application.

In some embodiments, based on the embodiment corresponding to FIG. 3, further referring to FIG. 17, FIG. 17 is a schematic structural diagram of another clock synchronization system-based DAQ unit according to an embodiment of this application. With reference to FIG. 3 and FIG. 17, in another embodiment of the clock synchronization system according to an embodiment of this application, the DAQ unit further includes an FPGA chip 208, the frequency conversion module 201 includes an eighth frequency conversion unit 2018, the signal synchronization module 202 includes an eighth synchronization unit 2028, and the eighth synchronization unit 2028 includes at least one DFF.

The eighth frequency conversion unit 2018 is configured to perform frequency conversion processing and PLL processing on the received reference clock signal to obtain an eighth frequency clock sub-signal and generate an eighth synchronization instruction according to the received global synchronization signal, where the eighth frequency clock sub-signal is included in the target clock signal, and the eighth synchronization instruction is included in the signal synchronization instruction.

The eighth frequency conversion unit 2018 is further configured to transmit the eighth synchronization instruction and the eighth frequency clock sub-signal to the eighth synchronization unit 2028.

The eighth synchronization unit 2028 is configured to perform, in response to the eighth synchronization instruction and based on the global synchronization signal, signal synchronization on the eighth frequency clock sub-signal through the at least one DFF included in the eighth synchronization unit 2028 to obtain an eighth synchronized clock sub-signal, where the eighth synchronized clock sub-signal is included in the synchronized clock signal.

The eighth synchronization unit 2028 is further configured to transmit the eighth synchronized clock sub-signal to the FPGA chip 208.

The FPGA chip 208 is configured to receive, according to the eighth synchronized clock sub-signal, a data signal transmitted by the ADC channel 205.

In this embodiment, by using a DAQ unit included in the digital/analog mutual conversion devices as an example, the DAQ unit includes a seventh synchronization unit and an eighth synchronization unit, where both the seventh synchronization unit and the eighth synchronization unit may be specifically a PLL/VCO. Based on this, the signal synchronization module includes a seventh synchronization unit and an eighth synchronization unit, where the seventh frequency conversion unit may be placed inside the seventh synchronization unit, or the seventh frequency conversion unit and the seventh synchronization unit are in a communication connection. Similarly, the eighth frequency conversion unit may be placed inside the eighth synchronization unit, or the eighth frequency conversion unit and the eighth synchronization unit are in a communication connection.

Specifically, a description is made below by using an example in which both the seventh frequency conversion unit and the eighth frequency conversion unit are a PLL/VCO. For ease of description, referring to FIG. 16 again, FIG. 16 is a schematic structural diagram of another clock synchronization system-based DAQ unit according to an embodiment of this application. As shown in the figure, it is assumed that Y DAQ units are included, and each DAQ unit corresponds to a reference clock signal, namely, there are Y reference clock signals in total, where Y is an integer greater than or equal to 1 and less than N. As can be known from the foregoing embodiments, the PLL/VCO corresponding to the seventh synchronization unit performs frequency conversion processing on the received reference clock signal to obtain a seventh frequency clock sub-signal and generates a seventh synchronization instruction according to the received global synchronization signal (Sync_GLB), and the PLL/VCO corresponding to the seventh synchronization unit then transmits the seventh synchronization instruction and the seventh frequency clock sub-signal to the seventh synchronization unit. The seventh synchronization unit performs, in response to the seventh synchronization instruction, signal synchronization on the seventh frequency clock sub-signal by using a DFF according to the global synchronization signal (Sync_GLB), to output a seventh synchronized clock sub-signal.

Similarly, the PLL/VCO corresponding to the eighth synchronization unit performs frequency conversion processing on the received reference clock signal to obtain an eighth frequency clock sub-signal and generates an eighth synchronization instruction according to the received global synchronization signal (Sync_GLB), and the PLL/VCO corresponding to the eighth synchronization unit then transmits the eighth synchronization instruction and the eighth frequency clock sub-signal to the eighth synchronization unit. The eighth synchronization unit performs, in response to the eighth synchronization instruction, signal synchronization on the eighth frequency clock sub-signal by using a DFF according to the global synchronization signal (Sync_GLB), to output an eighth synchronized clock sub-signal.

The seventh synchronized clock sub-signal and the eighth synchronized clock sub-signal have different frequencies. The seventh synchronization unit transmits the seventh synchronized clock sub-signal to the ADC channel, where the seventh synchronized clock sub-signal is an analog signal. The eighth synchronization unit transmits the eighth synchronized clock sub-signal to the FPGA chip. The FPGA chip determines, based on the eighth synchronized clock sub-signal, that clock synchronization has been completed by now, and therefore receives a data signal transmitted by the ADC channel.

Further, in the embodiments of this application, a clock synchronization system is provided. According to the foregoing system, a plurality of PLLs/VCOs are used to implement frequency conversion processing. Therefore, a signal on which frequency conversion processing has been performed may be further transmitted to the FPGA chip, to improve the feasibility and operability of the solution.

In some embodiments, based on the embodiment corresponding to FIG. 3, in another embodiment of the clock synchronization system according to an embodiment of this application, the clock synchronization system further includes a chassis, and the N digital/analog mutual conversion devices 20 include P pairs of AWGs and Q pairs of DAQ units, where each pair of AWGs includes two AWGs, each pair of DAQ units includes two DAQ units, and Q and P are both integers greater than or equal to 1;

the QCP 10, the P pairs of AWGs, and the Q pairs of DAQ units are all placed inside the chassis;

each pair of AWGs is distributed symmetrically by using the QCP 10 as a center; and each pair of DAQ units is distributed symmetrically by using the QCP 10 as a center.

In this embodiment, components included by the clock synchronization system may be alternatively integrated in a chassis, namely, a quantum control and measurement system that is simple and easy to use is provided, and the quantum control and measurement system can implement functions of the clock synchronization system. As a result, a quantum scientist can spend most energy on qubits without spending too much time on construction of auxiliary devices required for experiments.

Figure 18:
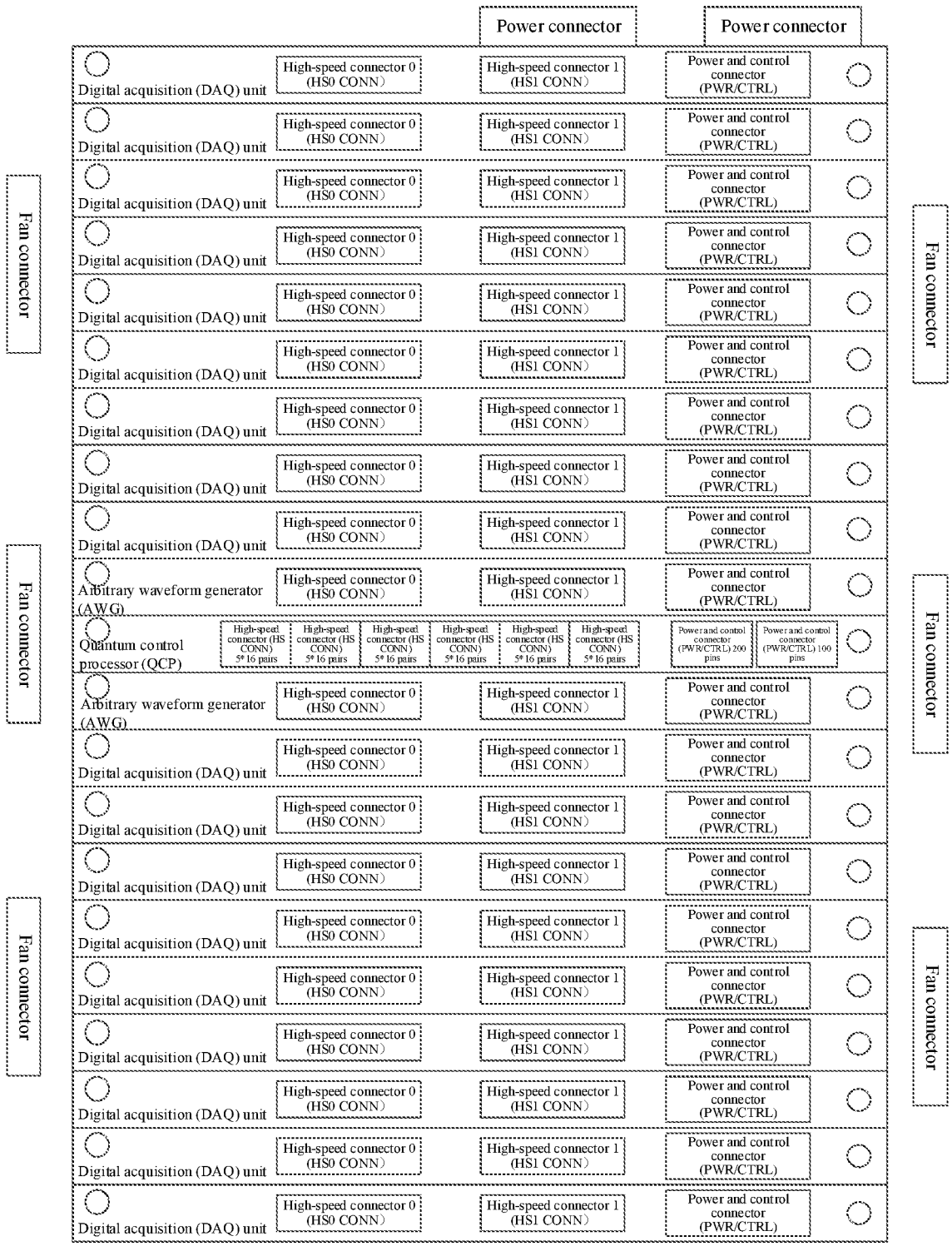
FIG. 18 is a schematic structural diagram of a clock synchronization system-based chassis according to an embodiment of this application.

Specifically, for ease of understanding, referring to FIG. 18, FIG. 18 is a schematic structural diagram of a clock synchronization system-based chassis according to an embodiment of this application. As shown in the figure, the chassis used in this application is a standard chassis similar to a standard ATCA and more adapted to current requirements through customization. A QCP is disposed at a middle position inside the chassis, and the QCP includes a high-speed connector (HS CONN) and a power and control connector (PWR/CTRL). In a case that quantities of the AWGs and the DAQ units are both even numbers, namely, P pairs of AWGs and Q pairs of DAQ units are included, each pair of AWGs is disposed on two sides of the QCP respectively and is distributed symmetrically, and similarly, each pair of DAQ units is disposed on two sides of the QCP respectively and is also distributed symmetrically.

FIG. 18 is used as an example. It is assumed that P is 9 and Q is 1, namely, there are 18 AWGs and 2 DAQ units, and it is assumed that each AWG has 16 DAC channels and each DAQ unit has 16 ADC channels. Then, there are 320 channels in total. In addition, an auxiliary power supply and fans are further disposed inside the chassis, and details are not described herein.

In addition, in the embodiments of this application, a clock synchronization system is provided. According to the foregoing system, the QCP is disposed at a middle position, so that lengths of clocks outputted by the QCP to the AWGs and the DAQ units are equal, thereby improving the reasonability of system deployment. When P is equal to 9 and Q is equal to 1,320 ADC channels and DAC channels may be supported, and a length, a width, and a height of an entire size of the chassis are approximately 700 millimeters, 370 millimeters, and 600 millimeters. Therefore, the system has high integration, does not require complex wiring among systems before experiments, and has a simple synchronization operation. In addition, costs are reduced.

In some embodiments, based on the embodiment corresponding to FIG. 3, in another embodiment of the clock synchronization system according to an embodiment of this application, the clock synchronization system further includes a chassis, and the N digital/analog mutual conversion devices 20 include K AWGs and (N−K) DAQ units, where K is an integer greater than or equal to 1 and less than N;

the QCP 10, the K AWGs, and the (N−K) DAQ units are all placed inside the chassis;

the K AWGs are disposed on one side of the QCP 10, or the K AWGs are disposed on two sides of the QCP 10; and the (N−K) DAQ units are disposed on one side of the QCP 10, or the (N−K) DAQ units are disposed on two sides of the QCP 10.

In this embodiment, components included by the clock synchronization system may be alternatively integrated in a chassis, namely, a quantum control and measurement system that is simple and easy to use is provided, and the quantum control and measurement system can implement functions of the clock synchronization system. As a result, a quantum scientist can spend most energy on qubits without spending too much time on construction of auxiliary devices required for experiments.

Figure 19:
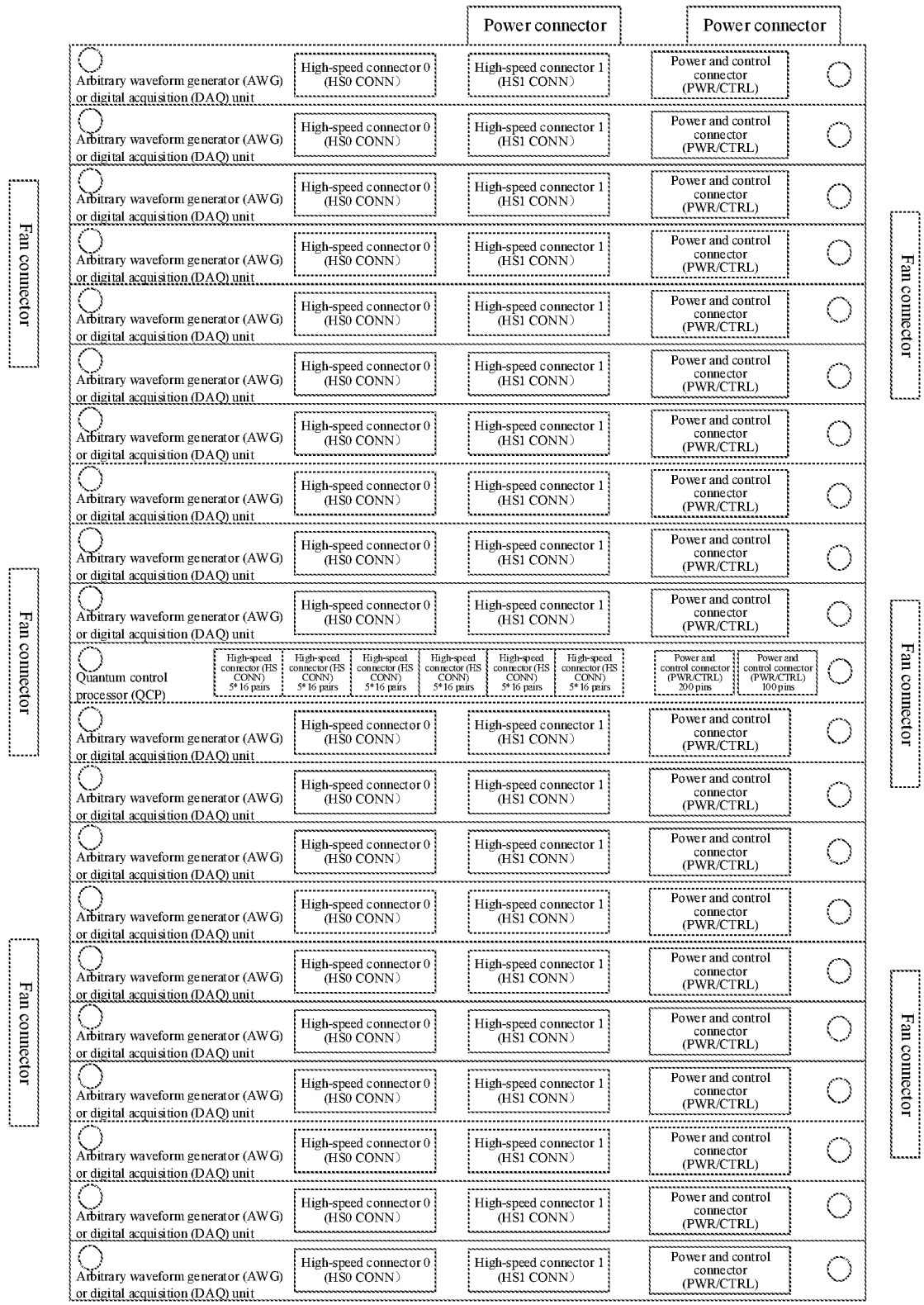
FIG. 19 is a schematic structural diagram of another clock synchronization system-based chassis according to an embodiment of this application.

Specifically, for ease of understanding, referring to FIG. 19, FIG. 19 is a schematic structural diagram of another clock synchronization system-based chassis according to an embodiment of this application. As shown in the figure, the chassis used in this application is a standard chassis similar to a standard ATCA and more adapted to current requirements through customization. A QCP is disposed at a middle position inside the chassis, and the QCP includes an HS CONN and a PWR/CTRL.

In a case that not all quantities of the AWGs and the DAQ units are even numbers, namely, K AWGs and (N−K) DAQ units are included, the AWGs and the DAQ units are disposed on two sides of the QCP randomly. FIG. 19 is used as an example. It is assumed that N is 20, and it is assumed that each AWG has 16 DAC channels and each DAQ unit has 16 ADC channels. Then, there are 320 channels in total. In addition, an auxiliary power supply and fans are further disposed inside the chassis, and details are not described herein.

In addition, in the embodiments of this application, a clock synchronization system is provided. According to the foregoing system, the QCP, the AWGs, and the DAQ units are disposed in the chassis, and positions of the components in the chassis may be adjusted flexibly, thereby improving the diversity and flexibility of component deployment.

Figure 20:
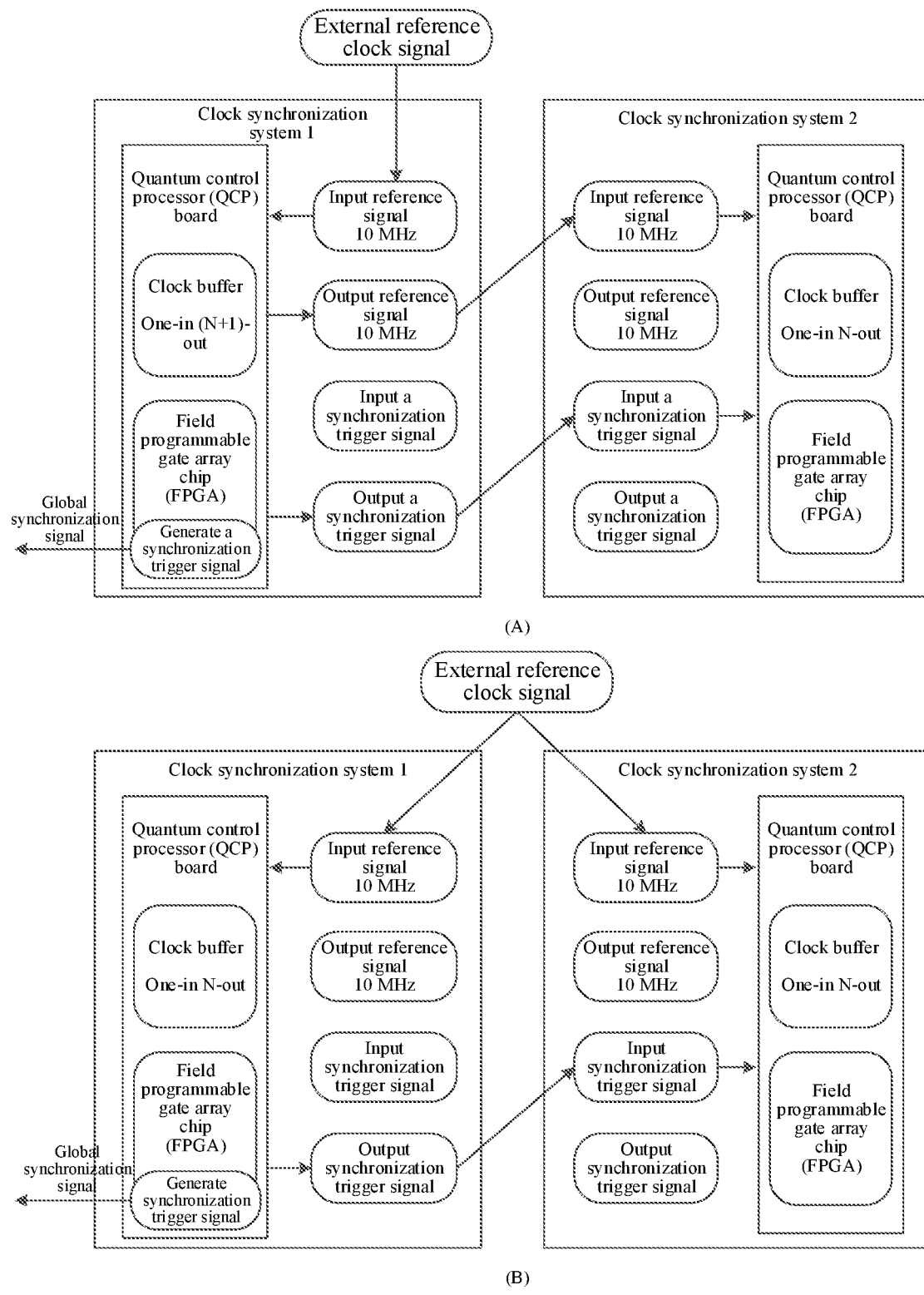
FIG. 20 is a schematic structural diagram of a plurality of cascaded clock synchronization systems according to an embodiment of this application.

With reference to the foregoing embodiments, referring to FIG. 20, FIG. 20 is a schematic structural diagram of a plurality of cascaded clock synchronization systems according to an embodiment of this application. As shown in the image (A) of FIG. 20, in a cascade manner, a clock synchronization system 1 obtains an external reference clock, and a QCP of the clock synchronization system 1 generates synchronization trigger signals by using an FPGA chip, where one synchronization trigger signal is used as a global synchronization signal of the clock synchronization system 1, and the other synchronization trigger signal is transmitted to a clock synchronization system 2 through a cable, to trigger a global synchronization signal of the clock synchronization system 2.

As shown in the image (B) of FIG. 20, in another cascade manner, the clock synchronization system 1 and the clock synchronization system 2 obtain respective external reference clocks, and the QCP of the clock synchronization system 1 generates a synchronization trigger signal by using the FPGA chip as the global synchronization signal of the clock synchronization system 1. A QCP of the clock synchronization system 2 generates a synchronization trigger signal by using an FPGA chip as the global synchronization signal of the clock synchronization system 2.

In some embodiments, based on the embodiment corresponding to FIG. 3, in another embodiment of the clock synchronization system according to an embodiment of this application, the N digital/analog mutual conversion devices 20 include an AWG and a DAQ unit, where the AWG includes a DAC channel 203, and the DAQ unit includes an ADC channel 205;

the QCP 10 is further configured to load an FPGA chip code file, where the FPGA chip code file includes a first register parameter, a second register parameter, a third register parameter, and a fourth register parameter;

the AWG is configured to write the first register parameter into a frequency conversion module 201 included in the AWG;

the DAQ unit is configured to write the second register parameter into a frequency conversion module 201 included in the DAQ unit;

the AWG is further configured to write the third register parameter into the DAC channel 203 included in the AWG; and the DAQ unit is further configured to write the fourth register parameter into the ADC channel 205 included in the DAQ unit.

In this embodiment, the N digital/analog mutual conversion devices in the clock synchronization system include at least one AWG and at least one DAQ unit, where each AWG include a DAC channel, a PLL/VCO, and a Div/Dly unit. Each DAQ unit includes an ADC channel, a PLL/VCO, and a Div/Dly unit. Before clock synchronization, the modules need to be further initialized based on the FPGA chip code file.

Figure 21:
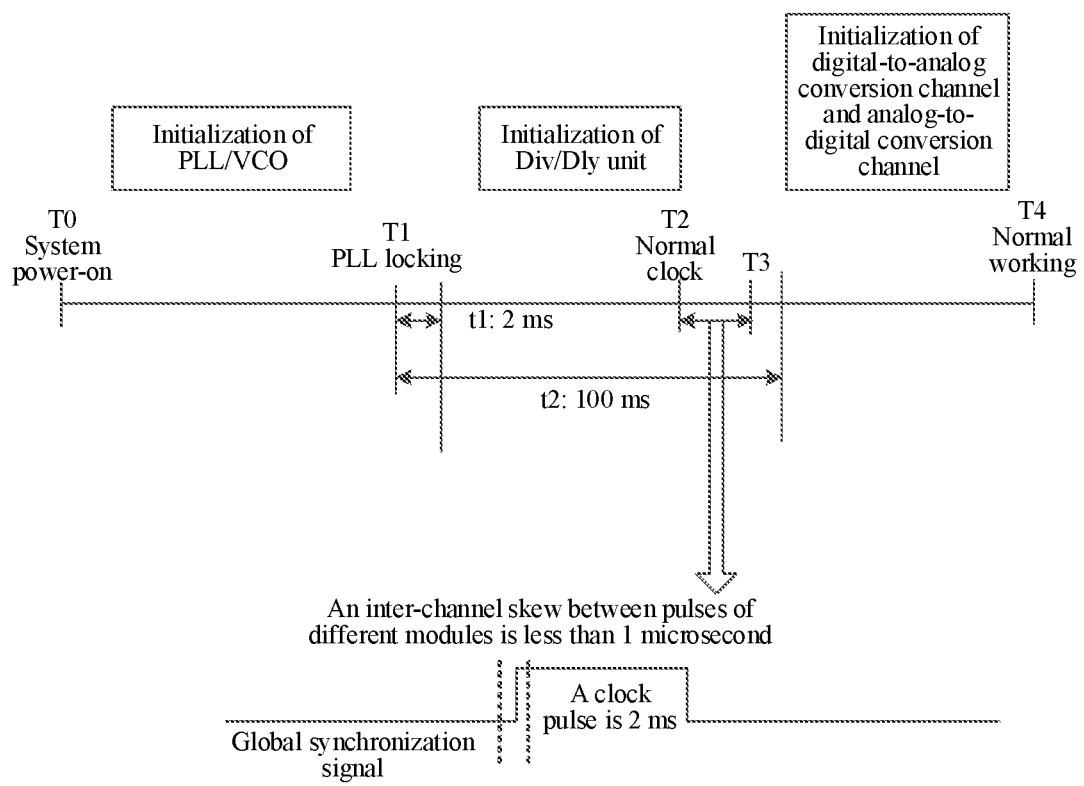
FIG. 21 is a schematic diagram of an embodiment of implementing signal synchronization according to an embodiment of this application.

Specifically, referring to FIG. 21, FIG. 21 is a schematic diagram of an embodiment of implementing signal synchronization according to an embodiment of this application. As shown in the figure, at a moment T0, power-on of the clock synchronization system is completed, and a normal operation mode is entered after the FPGA chip code file is loaded. The AWG writes the first register parameter into the PLL/VCO, and the DAQ unit writes the second register parameter into the PLL/VCO. At a moment T1, after receiving a locking indication signal of the FPGA chip code file, the FPGA chip waits for about 2 ms and completes writing of register parameters of the Div/Dly unit. That is, the AWG writes the first register parameter into the Div/Dly unit, and the DAQ unit writes the second register parameter into the Div/Dly unit.

A clock output is normal after waiting for about 2 ms. In this case, the FPGA chip of the QCP initiates a global synchronization signal, where time lengths in which the global synchronization signal reaches the modules are not strictly required to be equal provided that the global synchronization signal reaches the modules within 1 microsecond. At a moment T3, synchronization is completed. In this case, an FPGA chip of the AWG writes the third register parameter into the DAC channel to complete channel configuration. An FPGA chip of the DAQ unit writes the fourth register parameter into the ADC channel to complete channel configuration. At a moment T4, configuration is completed and a working mode is entered, and data of the ADC channel may begin to be received or data may begin to be transmitted to the DAC channel.

The QCP is further configured to load an FPGA chip code file, where the FPGA chip code file includes a first register parameter, a second register parameter, a third register parameter, and a fourth register parameter;

the AWG is configured to write the first register parameter into the frequency conversion module 201 included in the AWG;

the DAQ unit is configured to write the second register parameter into the frequency conversion module 201 included in the DAQ unit;

the AWG is further configured to write the third register parameter into the DAC channel 203 included in the AWG; and the DAQ unit is further configured to write the fourth register parameter into the ADC channel 205 included in the DAQ unit.

Figure 22:
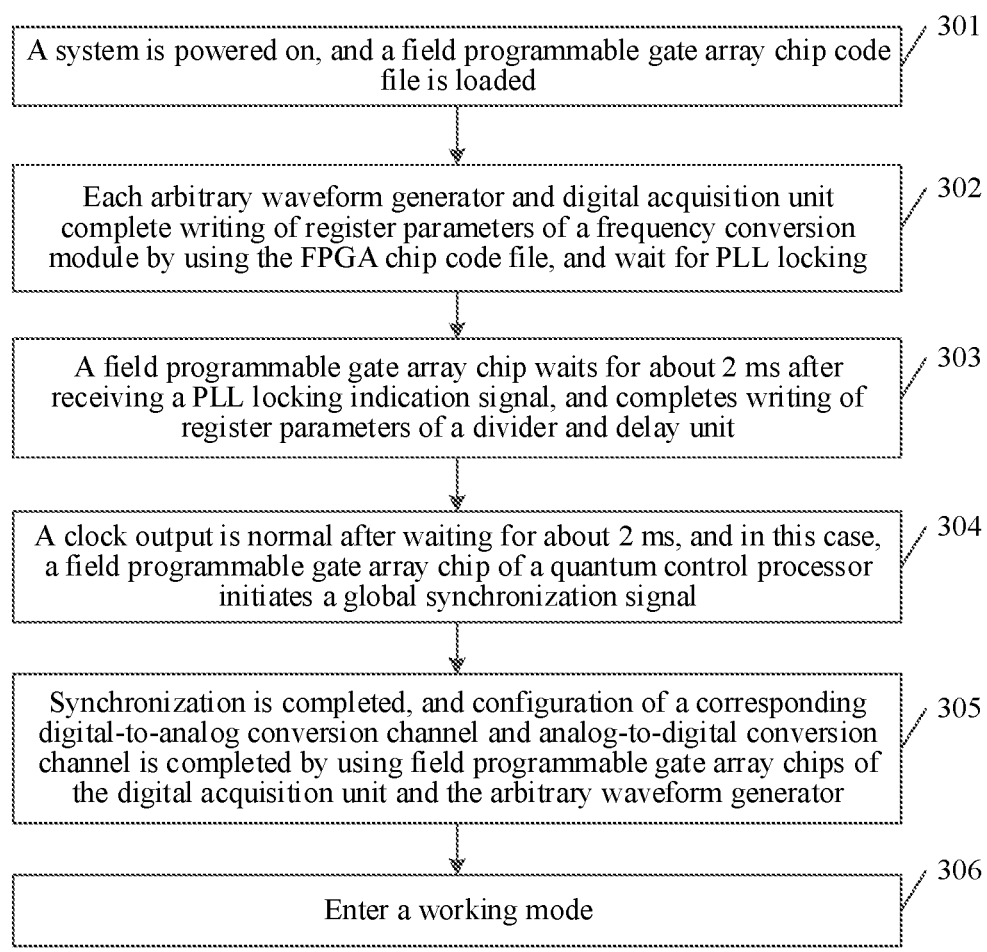
FIG. 22 is a schematic flowchart of implementing signal synchronization according to an embodiment of this application.

Further, the following describes a procedure of implementing signal synchronization with reference to FIG. 22. Referring to FIG. 22, FIG. 22 is a schematic flowchart of implementing signal synchronization according to an embodiment of this application. As shown in the figure, the procedure is specifically as follows:

In step 301, at a moment T0, power-on of the clock synchronization system is completed, and a normal operation mode is entered after the FPGA chip code file is loaded, where the FPGA chip code file includes a first register parameter, a second register parameter, a third register parameter, and a fourth register parameter.

In step 302, writing of register parameters of the PLL/VCO is completed by using the FPGA chip code file, and PLL locking is waited. Each AWG and DAQ unit complete writing of register parameters of the frequency conversion module by using the FPGA chip code file, and wait for PLL locking.

In step 303, an FPGA chip waits for about 2 ms after receiving a PLL locking indication signal, and completes writing of register parameters of the Div/Dly unit.

In step 304, a clock output is normal after waiting for about 2 ms. In this case, the FPGA chip of the QCP initiates a global synchronization signal.

In step 305, synchronization is completed, and configuration of the corresponding DAC channel and ADC channel is completed by using FPGA chips of the DAQ unit and the AWG.

In step 306, a working mode is entered.

In addition, in the embodiments of this application, a clock synchronization system is provided. According to the foregoing system, after the configuration is completed, a synchronization operation can be completed by only triggering a synchronization pulse. In addition, a quantity of channels integrated by the implemented quantum control and measurement system can support qubit tests of a 56-bit Gmon, and a skew between different channels may be less than 15 picoseconds (ps). The AWG outputs waveform synchronization test data. In a case that delay calibration is not enabled, an inter-channel skew between different channels of the same module is within 100 ps, and an inter-channel skew between channels of different modules is within 200 ps. In a case that delay calibration is enabled, an inter-channel skew between different channels is within 15 ps. Synchronization test data is inputted into the DAQ unit: When a sample rate is 1 conversion rate (GSPS), different channels may be completely aligned with each other.

Figure 23:
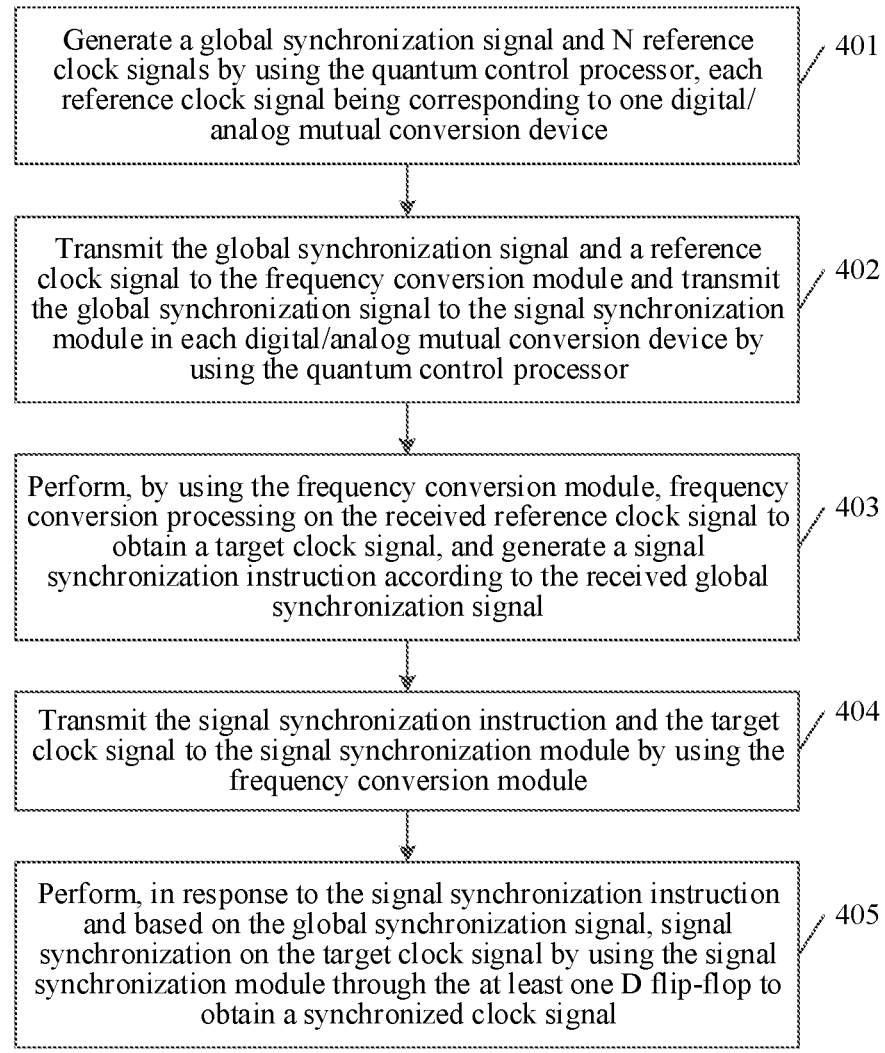
FIG. 23 is a schematic flowchart of a signal synchronization control method according to an embodiment of this application.

The following describes a signal synchronization control method in this application. Referring to FIG. 23, FIG. 23 is a schematic diagram of an embodiment of the signal synchronization control method according to an embodiment of this application. The signal synchronization control method is applicable to a clock synchronization system, the clock synchronization system includes a quantum control processor (QCP) and N digital/analog mutual conversion devices, each digital/analog mutual conversion device includes a frequency conversion module and a signal synchronization module, the signal synchronization module includes at least one DFF, N is an integer greater than 1, and the signal synchronization control method includes:

401. Generate a global synchronization signal and N reference clock signals by using the QCP, each reference clock signal being corresponding to one digital/analog mutual conversion device.

In this embodiment, the N digital/analog mutual conversion devices include at least one arbitrary waveform generator (AWG) and at least one digital acquisition (DAQ) unit. The QCP includes a clock buffer and a field programmable gate array (FPGA) chip, where an input of the clock buffer is 1 and an output is N, namely, N reference clock signals may be outputted, so that each digital/analog mutual conversion device corresponds to one reference clock signal. The FPGA chip outputs a global synchronization signal, and the N digital/analog mutual conversion devices all use a uniform global synchronization signal.

402. Transmit the global synchronization signal and a reference clock signal to the frequency conversion module and transmit the global synchronization signal to the signal synchronization module in each digital/analog mutual conversion device by using the QCP.

In this embodiment, the clock synchronization system transmits the global synchronization signal and the corresponding reference clock signal to the frequency conversion module and transmits the global synchronization signal to the signal synchronization module in each digital/analog mutual conversion device (the AWG and DAQ unit) by using the QCP.

403. Perform, by using the frequency conversion module, frequency conversion processing on the received reference clock signal to obtain a target clock signal, and generate a signal synchronization instruction according to the received global synchronization signal.

In this embodiment, the clock synchronization system performs, by using the frequency conversion module, frequency conversion processing on the received reference clock signal to obtain a target clock signal, and the frequency conversion module may further generate a signal synchronization instruction according to the received global synchronization signal.

404. Transmit the signal synchronization instruction and the target clock signal to the signal synchronization module by using the frequency conversion module.

In this embodiment, the clock synchronization system transmits the signal synchronization instruction and the target clock signal to the signal synchronization module by using the frequency conversion module, where the signal synchronization instruction is used for triggering clock synchronization.

405. Perform, in response to the signal synchronization instruction and based on the global synchronization signal, signal synchronization on the target clock signal by using the signal synchronization module through the at least one DFF to obtain a synchronized clock signal.

In this embodiment, the clock synchronization system performs, in response to the signal synchronization instruction and based on the global synchronization signal, signal synchronization on the target clock signal by using the signal synchronization module through one level of DFF or a plurality of levels of DFFs to obtain a synchronized clock signal. Generally, three levels of DFFs may be disposed.

In the embodiments of this application, a signal synchronization control method is provided. According to the foregoing method, after a global synchronization signal enters a signal synchronization module in a digital/analog mutual conversion device, a target clock signal is relocked to a low jitter reference clock signal by using one or more DFFs, thereby reducing signal delay and improving signal synchronization precision.

An embodiment of this application further provides a computer-readable storage medium, storing a computer program, the computer program, when run on a computer, causing the computer to perform the method according to the foregoing embodiments.

An embodiment of this application further provides a computer program product including instructions, the instructions, when run on a computer, causing the computer to perform the method according to the foregoing embodiments.

A person skilled in the art can clearly understand that for convenience and conciseness of description, for specific working processes of the foregoing systems, devices, and units, reference may be made to the corresponding processes in the foregoing method embodiments, and details are not described herein again.

In the several embodiments provided in this application, it is to be understood that the disclosed system, apparatus, and method may be implemented in other manners. For example, the described apparatus embodiment is merely an example. For example, the unit division is merely a logical function division and may be other division during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate components may or may not be physically separated, and the components displayed as units may or may not be physical units, and may be located in one place or may be distributed over a plurality of network units. Some or all of the units may be selected according to actual needs to achieve the objectives of the solutions of the embodiments.

In addition, functional units in the embodiments of this application may be integrated into one processing unit, or each of the units may be physically separated, or two or more units may be integrated into one unit. The integrated unit may be implemented in the form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to the related technology, or all or some of the technical solutions may be implemented in the form of a software product. The computer software product is stored in a storage medium and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or an optical disc. In this application, the term "unit" or "module" refers to a computer program or part of the computer program that has a predefined function and works together with other related parts to achieve a predefined goal and may be all or partially implemented by using software, hardware (e.g., processing circuitry and/or memory configured to perform the predefined functions), or a combination thereof. Each unit or module can be implemented using one or more processors (or processors and memory). Likewise, a processor (or processors and memory) can be used to implement one or more modules or units. Moreover, each module or unit can be part of an overall module that includes the functionalities of the module or unit.

The foregoing embodiments are merely intended for describing the technical solutions of this application, but not for limiting this application. Although this application is described in detail with reference to the foregoing embodiments, a person of ordinary skill in the art is to understand that they may still make modifications to the technical solutions described in the foregoing embodiments or make equivalent replacements to some technical features thereof, without departing from the spirit and scope of the technical solutions of the embodiments of this application.

What is claimed is:

1. A clock synchronization system, comprising a quantum control processor (QCP) and N digital/analog mutual conversion devices, each digital/analog mutual conversion device comprising a frequency conversion module and a signal synchronization module, the signal synchronization module comprising at least one D flip-flop (DFF), and N being an integer greater than 1;
   the QCP further comprising a synchronization signal generator being configured to generate a global synchronization signal and a clock signal generator distinct from the synchronization signal generator, the clock signal generator being configured to generate N reference clock signals, and each reference clock signal corresponding to a respective one of the N digital/analog mutual conversion devices;
   for each one of the N digital/analog mutual conversion devices:
      the synchronization signal generator being further configured to transmit the global synchronization signal to the frequency conversion module and the signal synchronization module, respectively, in the corresponding digital/analog mutual conversion device;
      the clock signal generator being further configured to transmit a respective one of the N reference clock signals to the frequency conversion module;
      the frequency conversion module being configured to perform frequency conversion processing on the received reference clock signal to obtain a target clock signal and generate a signal synchronization instruction according to the received global synchronization signal;
      the frequency conversion module being further configured to transmit the signal synchronization instruction and the target clock signal to the signal synchronization module; and
      the signal synchronization module being configured to perform, in response to the signal synchronization instruction and based on the global synchronization signal, signal synchronization on the target clock signal through the at least one DFF to obtain a synchronized clock signal.

2. The clock synchronization system according to claim 1, wherein the signal synchronization module comprises a first DFF, a second DFF, and a third DFF, wherein the first DFF is connected to the second DFF, and the second DFF is connected to the third DFF.

3. The clock synchronization system according to claim 1, wherein the N digital/analog mutual conversion devices comprise an arbitrary waveform generator (AWG), the AWG comprises a digital-to-analog conversion (DAC) channel, the frequency conversion module comprises a first frequency conversion unit and a second frequency conversion unit, the signal synchronization module comprises a first synchronization unit and a second synchronization unit, the first synchronization unit comprises at least one DFF, and the second synchronization unit comprises at least one DFF;
   the first frequency conversion unit is configured to perform frequency conversion processing on the received reference clock signal to obtain a first frequency clock sub-signal and generate a first synchronization instruction according to the received global synchronization signal, wherein the first frequency clock sub-signal is comprised in the target clock signal, and the first synchronization instruction is comprised in the signal synchronization instruction;
   the first frequency conversion unit is further configured to transmit the first synchronization instruction and the first frequency clock sub-signal to the first synchronization unit;
   the first synchronization unit is configured to perform, in response to the first synchronization instruction and based on the global synchronization signal, signal synchronization on the first frequency clock sub-signal through the at least one DFF comprised in the first synchronization unit to obtain a first synchronized clock sub-signal, wherein the first synchronized clock sub-signal is comprised in the synchronized clock signal;
   the first synchronization unit is further configured to transmit the first synchronized clock sub-signal to the second frequency conversion unit;
   the second frequency conversion unit is configured to perform frequency conversion processing and delay processing on the received first synchronized clock sub-signal to obtain a second frequency clock sub-signal and generate a second synchronization instruction according to the received global synchronization signal, wherein the second frequency clock sub-signal is comprised in the target clock signal, and the second synchronization instruction is comprised in the signal synchronization instruction;
   the second frequency conversion unit is further configured to transmit the second synchronization instruction and the second frequency clock sub-signal to the second synchronization unit;
   the second synchronization unit is configured to perform, in response to the second synchronization instruction and based on the global synchronization signal, signal synchronization on the second frequency clock sub-signal through the at least one DFF comprised in the second synchronization unit to obtain a second synchronized clock sub-signal, wherein the second synchronized clock sub-signal is comprised in the synchronized clock signal;
   the second synchronization unit is further configured to transmit the second synchronized clock sub-signal to the DAC channel, wherein the second synchronized clock sub-signal is a digital signal; and
   the DAC channel is configured to convert the second synchronized clock sub-signal into an analog signal.

4. The clock synchronization system according to claim 3, wherein the AWG further comprises a field programmable gate array (FPGA) chip;

the second synchronization unit is further configured to transmit the second synchronized clock sub-signal to the FPGA chip; and the FPGA chip is configured to transmit a data signal to the DAC channel according to the second synchronized clock sub-signal.

5. The clock synchronization system according to claim 1, wherein the N digital/analog mutual conversion devices comprise a digital acquisition (DAQ) unit, the DAQ unit belongs to the digital/analog mutual conversion devices, the DAQ unit comprises an analog-to-digital conversion (ADC) channel, the frequency conversion module comprises a third frequency conversion unit and a fourth frequency conversion unit, the signal synchronization module comprises a third synchronization unit and a fourth synchronization unit, the third synchronization unit comprises at least one DFF, and the fourth synchronization unit comprises at least one DFF;

the third frequency conversion unit is configured to perform frequency conversion processing on the received reference clock signal to obtain a third frequency clock sub-signal and generate a third synchronization instruction according to the received global synchronization signal, wherein the third frequency clock sub-signal is comprised in the target clock signal, and the third synchronization instruction is comprised in the signal synchronization instruction;

the third frequency conversion unit is further configured to transmit the third synchronization instruction and the third frequency clock sub-signal to the third synchronization unit;

the third synchronization unit is configured to perform, in response to the third synchronization instruction and based on the global synchronization signal, signal synchronization on the third frequency clock sub-signal through the at least one DFF comprised in the third synchronization unit to obtain a third synchronized clock sub-signal, wherein the third synchronized clock sub-signal is comprised in the synchronized clock signal;

the third synchronization unit is further configured to transmit the third synchronized clock sub-signal to the fourth frequency conversion unit;

the fourth frequency conversion unit is configured to perform frequency conversion processing and delay processing on the received third synchronized clock sub-signal to obtain a fourth frequency clock sub-signal and generate a fourth synchronization instruction according to the received global synchronization signal, wherein the fourth frequency clock sub-signal is comprised in the target clock signal, and the fourth synchronization instruction is comprised in the signal synchronization instruction;

the fourth frequency conversion unit is further configured to transmit the fourth synchronization instruction and the fourth frequency clock sub-signal to the fourth synchronization unit;

the fourth synchronization unit is configured to perform, in response to the fourth synchronization instruction and based on the global synchronization signal, signal synchronization on the fourth frequency clock sub-signal through the at least one DFF comprised in the fourth synchronization unit to obtain a fourth synchronized clock sub-signal, wherein the fourth synchronized clock sub-signal is comprised in the synchronized clock signal;

the fourth synchronization unit is further configured to transmit the fourth synchronized clock sub-signal to the ADC channel, wherein the fourth synchronized clock sub-signal is an analog signal; and the ADC channel is configured to convert the fourth synchronized clock sub-signal into a digital signal.

6. The clock synchronization system according to claim 5, wherein the DAQ unit further comprises an FPGA chip;

the fourth synchronization unit is further configured to transmit the fourth synchronized clock sub-signal to the FPGA chip; and the FPGA chip is configured to receive, according to the fourth synchronized clock sub-signal, a data signal transmitted by the ADC channel.

7. The clock synchronization system according to claim 1, wherein the N digital/analog mutual conversion devices comprise an AWG, the AWG belongs to the digital/analog mutual conversion devices, the AWG comprises a DAC channel, the frequency conversion module comprises a fifth frequency conversion unit, the signal synchronization module comprises a fifth synchronization unit, and the fifth synchronization unit comprises at least one DFF;

the fifth frequency conversion unit is configured to perform frequency conversion processing and phase locked loop (PLL) processing on the received reference clock signal to obtain a fifth frequency clock sub-signal and generate a fifth synchronization instruction according to the received global synchronization signal, wherein the fifth frequency clock sub-signal is comprised in the target clock signal, and the fifth synchronization instruction is comprised in the signal synchronization instruction;

the fifth frequency conversion unit is further configured to transmit the fifth synchronization instruction and the fifth frequency clock sub-signal to the fifth synchronization unit;

the fifth synchronization unit is configured to perform, in response to the fifth synchronization instruction and based on the global synchronization signal, signal synchronization on the fifth frequency clock sub-signal through the at least one DFF comprised in the fifth synchronization unit to obtain a fifth synchronized clock sub-signal, wherein the fifth synchronized clock sub-signal is comprised in the synchronized clock signal;

the fifth synchronization unit is further configured to transmit the fifth synchronized clock sub-signal to the DAC channel, wherein the fifth synchronized clock sub-signal is a digital signal; and the DAC channel is configured to convert the fifth synchronized clock sub-signal into an analog signal.

8. The clock synchronization system according to claim 7, wherein the AWG further comprises an FPGA chip, the frequency conversion module further comprises a sixth frequency conversion unit, the signal synchronization module further comprises a sixth synchronization unit, and the sixth synchronization unit comprises at least one DFF;

the sixth frequency conversion unit is configured to perform frequency conversion processing and PLL processing on the received reference clock signal to obtain a sixth frequency clock sub-signal and generate a sixth synchronization instruction according to the received global synchronization signal, wherein the sixth frequency clock sub-signal is comprised in the target clock signal, and the sixth synchronization instruction is comprised in the signal synchronization instruction;

the sixth frequency conversion unit is further configured to transmit the sixth synchronization instruction and the sixth frequency clock sub-signal to the sixth synchronization unit;

the sixth synchronization unit is configured to perform, in response to the sixth synchronization instruction and based on the global synchronization signal, signal synchronization on the sixth frequency clock sub-signal through the at least one DFF comprised in the sixth synchronization unit to obtain a sixth synchronized clock sub-signal, wherein the sixth synchronized clock sub-signal is comprised in the synchronized clock signal;

the sixth synchronization unit is further configured to transmit the sixth synchronized clock sub-signal to the FPGA chip; and the FPGA chip is configured to transmit a data signal to the DAC channel according to the sixth synchronized clock sub-signal.

9. The clock synchronization system according to claim 1, wherein the N digital/analog mutual conversion devices comprise a DAQ unit, the DAQ unit belongs to the digital/analog mutual conversion devices, the DAQ unit comprises an ADC channel, the frequency conversion module comprises a seventh frequency conversion unit, the signal synchronization module comprises a seventh synchronization unit, and the seventh synchronization unit comprises at least one DFF;

the seventh frequency conversion unit is configured to perform frequency conversion processing and PLL processing on the received reference clock signal to obtain a seventh frequency clock sub-signal and generate a seventh synchronization instruction according to the received global synchronization signal, wherein the seventh frequency clock sub-signal is comprised in the target clock signal, and the seventh synchronization instruction is comprised in the signal synchronization instruction;

the seventh frequency conversion unit is further configured to transmit the seventh synchronization instruction and the seventh frequency clock sub-signal to the seventh synchronization unit;

the seventh synchronization unit is configured to perform, in response to the seventh synchronization instruction and based on the global synchronization signal, signal synchronization on the seventh frequency clock sub-signal through the at least one DFF comprised in the seventh synchronization unit to obtain a seventh synchronized clock sub-signal, wherein the seventh synchronized clock sub-signal is comprised in the synchronized clock signal;

the seventh synchronization unit is further configured to transmit the seventh synchronized clock sub-signal to the ADC channel, wherein the seventh synchronized clock sub-signal is an analog signal; and the ADC channel is configured to convert the seventh synchronized clock sub-signal into a digital signal.

10. The clock synchronization system according to claim 9, wherein the DAQ unit further comprises an FPGA chip, the frequency conversion module comprises an eighth frequency conversion unit, the signal synchronization module comprises an eighth synchronization unit, and the eighth synchronization unit comprises at least one DFF;

the eighth frequency conversion unit is configured to perform frequency conversion processing and PLL processing on the received reference clock signal to obtain an eighth frequency clock sub-signal and generate an eighth synchronization instruction according to the received global synchronization signal, wherein the eighth frequency clock sub-signal is comprised in the target clock signal, and the eighth synchronization instruction is comprised in the signal synchronization instruction;

the eighth frequency conversion unit is further configured to transmit the eighth synchronization instruction and the eighth frequency clock sub-signal to the eighth synchronization unit;

the eighth synchronization unit is configured to perform, in response to the eighth synchronization instruction and based on the global synchronization signal, signal synchronization on the eighth frequency clock sub-signal through the at least one DFF comprised in the eighth synchronization unit to obtain an eighth synchronized clock sub-signal, wherein the eighth synchronized clock sub-signal is comprised in the synchronized clock signal;

the eighth synchronization unit is further configured to transmit the eighth synchronized clock sub-signal to the FPGA chip; and the FPGA chip is configured to receive, according to the eighth synchronized clock sub-signal, a data signal transmitted by the ADC channel.

11. The clock synchronization system according to claim 1, wherein the clock synchronization system further comprises a chassis, and the N digital/analog mutual conversion devices comprise P pairs of AWGs and Q pairs of DAQ units, wherein each pair of AWGs comprises two AWGs, each pair of DAQ units comprises two DAQ units, and Q and P are both integers greater than or equal to 1;

the QCP, the P pairs of AWGs, and the Q pairs of DAQ units are all placed inside the chassis;

each pair of AWGs is distributed symmetrically by using the QCP as a center; and each pair of DAQ units is distributed symmetrically by using the QCP as a center.

12. The clock synchronization system according to claim 1, wherein the clock synchronization system further comprises a chassis, and the N digital/analog mutual conversion devices comprise K AWGs and (N−K) DAQ units, wherein K is an integer greater than or equal to 1 and less than N;

the QCP, the K AWGs, and the (N−K) DAQ units are all placed inside the chassis;

the K AWGs are disposed on one side of the QCP, or the K AWGs are disposed on two sides of the QCP; and the (N−K) DAQ units are disposed on one side of the QCP, or the (N−K) DAQ units are disposed on two sides of the QCP.

13. The clock synchronization system according to claim 1, wherein the N digital/analog mutual conversion devices comprise an AWG and a DAQ unit, the AWG comprises a DAC channel, and the DAQ unit comprises an ADC channel;

the QCP is further configured to load an FPGA chip code file, wherein the FPGA chip code file comprises a first register parameter, a second register parameter, a third register parameter, and a fourth register parameter;

the AWG is configured to write the first register parameter into the frequency conversion module comprised in the AWG;

the DAQ unit is configured to write the second register parameter into the frequency conversion module comprised in the DAQ unit;

the AWG is further configured to write the third register parameter into the DAC channel comprised in the AWG; and the DAQ unit is further configured to write the fourth register parameter into the ADC channel comprised in the DAQ unit.

14. A signal synchronization control method performed by a clock synchronization system, the clock synchronization system comprising a quantum control processor (QCP) and N digital/analog mutual conversion devices, the QCP comprising a synchronization signal generator and a clock signal generator distinct from the synchronization signal generator, each digital/analog mutual conversion device comprising a frequency conversion module and a signal synchronization module, the signal synchronization module comprising at least one D flip-flop (DFF), N being an integer greater than 1, and the signal synchronization control method comprising:

generating a global synchronization signal by using the synchronization signal generator in the QCP and N reference clock signals by using the clock signal generator in the QCP, each reference clock signal being corresponding to a respective one of the N digital/analog mutual conversion devices;

for each one of the N digital/analog mutual conversion devices:

transmitting, by the synchronization signal generator, the global synchronization signal to the frequency conversion module and the signal synchronization module, respectively, in the corresponding digital/analog mutual conversion device;

transmitting, by the clock signal generator, a respective one of the N reference clock signals to the frequency conversion module;

performing, by the frequency conversion module, frequency conversion processing on the received reference clock signal to obtain a target clock signal, and generating a signal synchronization instruction according to the received global synchronization signal;

transmitting the signal synchronization instruction and the target clock signal to the signal synchronization module by using the frequency conversion module; and performing, in response to the signal synchronization instruction and based on the global synchronization signal, signal synchronization on the target clock signal by using the signal synchronization module through the at least one DFF to obtain a synchronized clock signal.

15. The signal synchronization control method according to claim 14, wherein the signal control method further comprises loading, by the QCP, an FPGA chip code file, wherein the FPGA chip code file comprises a first register parameter, a second register parameter, a third register parameter, and a fourth register parameter.

16. The signal synchronization control method according to claim 15, wherein the signal control method further comprises writing, by an AWG of the N digital/analog mutual conversion devices, the first register parameter into the frequency conversion module comprised in the AWG.

17. The signal synchronization control method according to claim 16, wherein the signal control method further comprises writing, by an DAQ unit of the N digital/analog mutual conversion devices, the second register parameter into the frequency conversion module comprised in the DAQ unit.

18. The signal synchronization control method according to claim 17, wherein the signal control method further comprises:

writing, by the AWG, the third register parameter into a DAC channel comprised in the AWG; and writing, by the DAQ unit, the fourth register parameter into an ADC channel comprised in the DAQ unit.

19. A non-transitory computer-readable storage medium, storing a plurality of computer programs, the computer programs, when executed by a clock synchronization system, the clock synchronization system comprising a quantum control processor (QCP) and N digital/analog mutual conversion devices, the QCP comprising a synchronization signal generator and a clock signal generator distinct from the synchronization signal generator, each digital/analog mutual conversion device comprising a frequency conversion module and a signal synchronization module, the signal synchronization module comprising at least one D flip-flop (DFF), N being an integer greater than 1, being configured to perform a signal control method including:

generating a global synchronization signal by using the synchronization signal generator in the QCP and N reference clock signals by using the clock signal generator in the QCP, each reference clock signal being corresponding to a respective one of the N digital/analog mutual conversion devices;

for each one of the N digital/analog mutual conversion devices:

transmitting, by the synchronization signal generator, the global synchronization signal to the frequency conversion module and the signal synchronization module, respectively, in the corresponding digital/analog mutual conversion device;

transmitting, by the clock signal generator, a respective one of the N reference clock signals to the frequency conversion module;

performing, by using the frequency conversion module, frequency conversion processing on the received reference clock signal to obtain a target clock signal, and generating a signal synchronization instruction according to the received global synchronization signal;

transmitting the signal synchronization instruction and the target clock signal to the signal synchronization module by using the frequency conversion module; and performing, in response to the signal synchronization instruction and based on the global synchronization signal, signal synchronization on the target clock signal by using the signal synchronization module through the at least one DFF to obtain a synchronized clock signal.

20. The non-transitory computer-readable storage medium according to claim 19, wherein the signal control method further comprises loading, by the QCP, an FPGA chip code file, wherein the FPGA chip code file comprises a first register parameter, a second register parameter, a third register parameter, and a fourth register parameter.

* * * * *